(12) United States Patent
Ashworth et al.

(10) Patent No.: US 10,731,042 B2
(45) Date of Patent: Aug. 4, 2020

(54) CONFORMAL COATING, COMPOSITION AND METHOD FOR THE MITIGATION OF GROWTH OF METALLIC CRYSTALLINE STRUCTURES

(71) Applicant: LOUGHBOROUGH UNIVERSITY, Loughborough (GB)

(72) Inventors: Mark Andrew Ashworth, Nuneaton (GB); Helen Elizabeth Pearson, Swadlincote (GB); Xujin Bao, Loughborough (GB); Geoffrey David Wilcox, Long Eaton (GB)

(73) Assignee: LOUGHBOROUGH UNIVERSITY, Loughborough (GB)

( * ) Notice: Subject to any disclaimer, the term of this patent is extended or adjusted under 35 U.S.C. 154(b) by 84 days.

(21) Appl. No.: 15/558,956

(22) PCT Filed: Mar. 18, 2016

(86) PCT No.: PCT/EP2016/055943
§ 371 (c)(1),
(2) Date: Sep. 15, 2017

(87) PCT Pub. No.: WO2016/146810
PCT Pub. Date: Sep. 22, 2016

(65) Prior Publication Data
US 2018/0072897 A1 Mar. 15, 2018

(30) Foreign Application Priority Data
Mar. 18, 2015 (GB) .................................. 1504551.1

(51) Int. Cl.
C08K 7/00 (2006.01)
C09D 7/40 (2018.01)
C09D 5/00 (2006.01)
H05K 3/28 (2006.01)
C09D 7/61 (2018.01)
C09D 7/62 (2018.01)
C09D 175/04 (2006.01)
C08K 3/34 (2006.01)
C08K 9/02 (2006.01)
C08K 9/04 (2006.01)
H05K 1/03 (2006.01)

(52) U.S. Cl.
CPC .................. C09D 7/70 (2018.01); C09D 5/00 (2013.01); C09D 7/61 (2018.01); C09D 7/62 (2018.01); C09D 175/04 (2013.01); H05K 3/28 (2013.01); H05K 3/285 (2013.01); C08K 3/346 (2013.01); C08K 7/00 (2013.01); C08K 9/02 (2013.01); C08K 9/04 (2013.01); C08K 2201/004 (2013.01); C08K 2201/005 (2013.01); C08K 2201/011 (2013.01); H05K 1/0373 (2013.01); H05K 2201/0209 (2013.01); H05K 2201/0245 (2013.01); H05K 2201/0769 (2013.01); H05K 2201/09872 (2013.01)

(58) Field of Classification Search
CPC .......... C09D 7/70; C09D 7/61; C09D 7/1291; C09D 7/1216; C09D 7/1225; C09D 5/00; C09D 175/04; C08K 2001/005; C08K 2201/004; C08K 2201/005
USPC ........................................................ 523/216
See application file for complete search history.

(56) References Cited

U.S. PATENT DOCUMENTS

| 6,835,766 | B1 | 12/2004 | Gao et al. |
| 7,604,871 | B2 | 10/2009 | Jackson et al. |
| 8,329,248 | B2 | 12/2012 | Jackson et al. |
| 8,367,193 | B1 | 2/2013 | Karim et al. |
| 2005/0228104 | A1 | 10/2005 | Feeney et al. |
| 2008/0216704 | A1 | 9/2008 | Eisenbeis et al. |
| 2009/0098395 | A1 | 4/2009 | Lu |
| 2010/0126342 | A1* | 5/2010 | Lopez .................. B01D 53/228 95/52 |
| 2013/0171405 | A1 | 7/2013 | Meschter et al. |
| 2013/0309495 | A1 | 11/2013 | Do et al. |
| 2014/0193590 | A1* | 7/2014 | Sue .......................... C08J 5/005 427/512 |
| 2014/0342097 | A1 | 11/2014 | Deshpande |
| 2014/0342113 | A1 | 11/2014 | Deshpande et al. |

FOREIGN PATENT DOCUMENTS

| WO | 2006-069128 A1 | 6/2006 |
| WO | 2007-143644 A1 | 12/2007 |
| WO | 2008-067293 A3 | 6/2008 |
| WO | 2008-112433 | 9/2008 |

OTHER PUBLICATIONS

BYK Additives & Instruments, "Cloisite 10A"; Germany, Issue Oct. 2013, all pages.
BYK Additives & Instruments, "Cloisite 30B"; Germany, Issue Oct. 2013, all pages.
BYK Additives & Instruments, "Cloisite NA+"; Germany, Issue Oct. 2013, all pages.
Search Report issued by the Intellectual Property Office dated Oct. 27, 2015 in GB Application No. 1504551.1, London, all pages.
GB 201504551 received an Examination Report dated Feb. 13, 2020, 3 pages.

* cited by examiner

Primary Examiner — Hannah J Pak
(74) Attorney, Agent, or Firm — Kilpatrick Townsend & Stockton LLP

(57) ABSTRACT

A nanocomposite coating composition for use in the mitigation of whisker growth from a metallic surface (82) includes a polymer matrix (86) comprising a base polymer and insulating material nanoplatelets (85), for example clay nanoplatelets, within the polymer matrix (86). A conformal coating (84) for application to a metal surface (82) is formed from the coating composition. The conformal coating mitigates the spontaneous growth of whiskers (83), in particular tin whiskers, from the coated surface (82), reducing the risk of short-circuits caused by such whiskers bridging gaps within electronic devices. Methods are provided for the preparation of coating compositions and coatings.

15 Claims, 12 Drawing Sheets

CONFORMAL COATING, COMPOSITION AND METHOD FOR THE MITIGATION OF GROWTH OF METALLIC CRYSTALLINE STRUCTURES

CROSS-REFERENCE TO RELATED APPLICATIONS

This application is a U.S. National Stage of PCT Application No. PCT/EP2016/055943, filed Mar. 18, 2016, which claims priority to Foreign Application No. 10504551.1 GB, filed Mar. 18, 2015. Each of these applications are hereby incorporated by reference in their entirety for all purposes.

TECHNICAL FIELD

The present invention relates generally to methods and materials for use in the mitigation of growth of metallic crystalline structures (commonly referred to as "whiskers") from metallic surfaces.

BACKGROUND ART

The spontaneous formation of crystalline structures from conductive metallic surfaces is now a well-known problem where metal-coated electronic devices are concerned.

Such growth may occur from a wide range of metallic surfaces. Tin is a metal which is commonly used as a plating on electronic devices, and the crystalline structures which grow spontaneously from such tin plating have become known informally as "tin whiskers".

The main problem arising from tin whiskers and similar crystalline structures is that they can reach considerable lengths, with some whiskers having been reported to be over 10 mm long. Tin whiskers can therefore easily bridge the small gaps between components and other conducting parts of an electrical device, thereby causing a short circuit. Once the short circuit has occurred, if the current conducted by the whisker is sufficiently large the tin whiskers are likely to melt or evaporate, so that often the cause of the occurrence is not clear. In the case of small currents, up to a few milliamps, the whiskers can often continue to produce shorting. This can lead to permanent failure of electrical devices with potentially devastating consequences. Larger currents can cause melting of the tin and sometimes the production of a tin vapour which can facilitate the passage of a current as an arc.

For example, the Galaxy IV satellite loss has been attributed to tin whisker growth. Other significant failures include car electronics failures and heart pacemaker failures.

Even if complete failure of the device does not occur, tin whisker growth can easily compromise the reliability, longevity and functionality of electrical devices.

Conformal coatings are often applied to electronic devices to protect against moisture, dust, chemicals and extreme temperatures. Ordinary conformal coatings, commonly used to coat electronic substrates, do not provide a sufficient deterrent to tin whisker growth. Conformal coatings are not designed to prevent whisker growth, but for other purposes such as to prevent dirt and moisture from contacting the electronics in the device.

Previously, the stiffness of coatings has been increased in an attempt to prevent or retard tin whisker growth. The stiffness of coatings has been increased by either alteration of the coating chemistry (for example by using a more highly cross-linked polymer which not only increases the stiffness but also increases the chemical resistance of the coating), or by the introduction of filler particles into the coating composition to create a composite. The former is not satisfactory because the coating becomes much more difficult to remove from the substrate, which is not desirable for devices which need to be inspected or repaired (re-worked). Conformal coatings often need to be removed in order to inspect, adjust or clean the device underneath, and may be transparent so that the underlying substrate or device can be seen.

Attempts have therefore been made to mitigate tin whisker growth by the application of a modified conformal coating including filler particles to the surface of the conducting metal.

US 2013/0171405 describes a method of obstructing metal whisker growth that includes providing a conductive structure comprised of a whisker forming metal, and forming a composite coating on the whisker forming metal. The composite coating may include a matrix phase of a polymer and a dispersed phase of reinforcing particles. The reinforcing particles are intended to provide the coating with enhanced hardness, peel force or rupture force.

WO 2007/143644 describes a conformal coating including a polymer matrix with hard or soft particles dispersed therein. Whiskers which penetrate the coating are deflected by the particles to reduce further penetration into, and protrusion through, the coating.

Similarly, WO 2008/067293 and US 2008/0216704 describe coatings including particles which act to deflect tin whiskers which penetrate the coating, or provide a "tortuous path" for the tin whiskers to reduce the likelihood that they will grow far enough to break the coating surface.

Tin Whisker Growth

Tin whiskers are metallic crystalline tin structures which emerge from the surface of tin metal and grow outwards from the surface in an elongated protrusion. They grow in a number of forms including filamentary, nodular and odd-shaped eruptions. FIG. 1 shows SEM images of the surface of tin with a multitude of tin whiskers clearly visible.

As noted above, the problems caused by tin whisker growth can be very serious. Tin whiskers can grow to considerable lengths and bridge gaps between two different parts of a structure, even where such gaps are relatively large. When such bridging occurs between two conducting parts of an electrical circuit, a short circuit arises with potentially serious consequences. Even where a short circuit does not occur, the performance of the device is likely to be compromised. Whiskers may become detached causing shorting events in other areas of the electronic device. Whiskers can vapourise with the passage of larger electrical currents. The tin metal vapour can promote serious high current arcing. Finally, whiskers can cause distortion of electronic signals due to an 'aerial' effect.

Previous Attempts at Tin Whisker Growth Mitigation

Ordinary conformal coatings commonly used to coat electronic substrates do not provide a complete mitigation of tin whisker growth. Conformal coatings are not designed to prevent whisker growth, but for other purposes such as to prevent dirt and moisture from contacting the device. FIGS. 2 and 3 show tin whiskers penetrating standard conformal coatings and continuing to grow away from the surface as normal.

Previously, the stiffness of coatings has been increased in an attempt to prevent or retard tin whisker growth. FIG. 4 shows a tin whisker flattened by interaction with a stiff coating. The stiffness of coatings has been increased by either alteration of the coating chemistry, or by the introduction of particulates into the coating composition to create a composite. The former is not satisfactory because the coating becomes much more difficult to remove from the substrate, which is not desirable for devices which need to be inspected or repaired.

FIG. 5(a) shows the penetration of a tin whisker through a low-stiffness coating. The coating presents almost no protection against the growth of tin whiskers.

FIG. 5(b) shows the effect on tin whiskers when a coating of intermediate stiffness is applied to a metallic surface. "Tenting" of the coating occurs as can be seen from the SEM image, before eventual penetration of the whisker through the coating. Further growth of the whisker may then occur. The overall effect of the coating is simply delaying whisker growth.

FIG. 5(c) shows a high stiffness coating applied to a metal surface. No tenting or whisker penetration occurs. However, the coating is not easily removed from the surface which is a significant disadvantage when access to the surface is required after the coating has been applied.

None of the methods outlined in the documents discussed previously are certain to prevent the growth of tin whiskers. Rather, they provide coatings which deflect or slow down the growth, or simply provide a coating with enhanced stiffness. There is, therefore, a need for enhanced coating compositions and conformal coatings which more directly address the problem of tin whisker growth and provide effective mitigation of the growth of all kinds of metallic crystalline structures. Such coatings could more fully address the problems described above. There is also a need for coatings which offer effective mitigation of metallic crystalline structure growth, but retain desirable properties of workability, removability and/or transparency.

SUMMARY OF THE INVENTION

The present invention has been devised in order to address at least one of the above problems. Preferably, the invention reduces, ameliorates, avoids or overcomes at least one of the above problems. In particular, the invention allows for the provision of a more effective barrier to tin whisker growth.

Whiskers may be understood to be metallic crystalline structures which grow spontaneously from the surfaces of metals, often in a filament-like formation. Other growths also occur which may be commonly included in the general descriptive term 'whisker'. These include nodules and odd-shaped eruptions. Such growths may occur from a variety of metals including Sn, Zn, Cd, In, Al, Pb, Au, Ag and Sb.

Tin whiskers may be understood to refer specifically to the metallic crystalline structures which grow spontaneously from tin surfaces. They can reach a length of up to 5.0 mm, but have been known to grow as long as 10 mm or more.

Conformal coating may be understood to refer to coatings applied to electronic assemblies, or at least a part of an electrical device, such as a PCB, to protect it.

"Nanoplatelets" may be understood to denote platelets or a group thereof, wherein at least one dimension lies within the nanoscale, that is less than or equal to 100 nm. In the case of nanoplatelets, this is usually the thickness. The length and width of the nanoplatelet may be outside the nanoscale. The nanoplatelet size may be tailored by clay selection and the extent of exfoliation.

"Tactoid" refers to a bundle of nanoplatelets such that each dimension is outside the nanoscale, i.e. greater than 100 nm.

Layered silicate clays are a particular form of natural or synthetic silicate where the silicate groups form sheets which in turn form a part of a layer. The layers have a high surface area. Relatively weak forces of attraction between layers allow them to be separated by the intercalation of compounds between layers.

Aspect ratio refers to the ratio of the length of a nanoplatelet to its thickness.

Base polymer refers to the polymer, copolymer or mixture of polymers which makes up the bulk of the polymer matrix of the coating composition.

Clay inter-layer spacing refers to the distance between two layers within the layered silicate clay.

Intercalation commonly refers to the movement of a compound into the space between layers of the layered silicate clay. This may be a polymer, chemical compound or ionic species.

Exfoliation commonly refers to the process which may occur after intercalation in which the inter-layer spacing of the clay further increases and the layers separate to form discrete exfoliated nanoplatelets.

Coating Composition

A first aspect of the invention provides a nanocomposite coating composition for use in mitigation of whisker growth by application of the composition to a metallic surface to form a conformal coating, wherein the composition comprises a polymer matrix comprising a base polymer, and insulating material nanoplatelets within the polymer matrix.

The nanocomposite composition may be used to form a coating on an electronic substrate or device comprising at least in part a metallic surface which is prone to the growth of crystalline structures (whiskers) such as tin whiskers. Rather than simply increasing the stiffness of the coating formed from the composition, or providing a "tortuous path" for the whiskers, the coating composition of the present invention provides a more effective barrier to tin whisker growth.

The use of insulating material nanoplatelets within the polymer matrix of the coating composition provides the advantage that a barrier to whisker growth is present within the coating. The whiskers are not simply delayed or given a "tortuous path", but are presented with a significant physical barrier which inhibits their passage through the coating. The nanoplatelets may form an overlapping structure within the polymer matrix leaving few open spaces through which whiskers may grow.

A second aspect of the invention is a nanocomposite coating composition for use in mitigation of whisker growth by application of the composition to a metallic surface to form a conformal coating, wherein the composition comprises a polymer matrix comprising a base polymer, and clay nanoplatelets within the polymer matrix, formed by the intercalation and/or exfoliation of a layered silicate clay with the base polymer.

The properties of layered silicate clays allow them to undergo the processes of intercalation and exfoliation, in which the layers of the clay separate to create clay nanoplatelets.

Due to the unique exfoliation process, the resultant nanocomposite includes a polymer matrix with the clay nanoplatelets embedded within the matrix. This provides a dense, overlapping barrier of clay nanoplatelets which acts as a highly effective mitigation towards whisker growth. Whiskers cannot easily penetrate this barrier and their outward growth is severely limited.

As a result, a coating composition is provided which is capable of forming a highly effective conformal coating for the mitigation of whisker growth. This provides improved protection against the detrimental effects of whisker growth on electronic devices. The functionality, longevity and reliability of the device are improved.

Furthermore, the resultant conformal coating retains the desirable properties associated with conformal coatings commonly used in electrical devices. The coating can be thin while still forming an effective barrier to whisker growth. This reduces the amount of materials required and also keeps the space used to a minimum, which is crucial in modern electronic devices. The coating also retains workability, and may be removed from the device in order to inspect and if necessary repair the components underneath. The coating can also be transparent, allowing the device to be viewed through the coating to determine the type of components present and their electronic specification.

A third aspect of the present invention is a nanocomposite coating composition for use in mitigation of whisker growth by application of the composition to a metallic surface to form a conformal coating, wherein the composition comprises a polymer matrix comprising a base polymer, and clay nanoplatelets within the polymer matrix, the clay nanoplatelets being of silicate clay material.

The nanoplatelets being of silicate clay material provides the benefits described above under the first aspect.

Optional Preferences for the Coating Composition According to the First, Second or Third Aspects The insulating material nanoplatelets may be of any suitable insulating material which has the ability to undergo intercalation and exfoliation to produce discrete nanoplatelets. This could include synthesised nano-ceramic particles with sheet-like morphologies, or natural materials such as clays.

The coating composition may be for the mitigation of tin whisker growth.

Although the coating composition is suitable for providing a barrier coating to prevent growth of a wide range of whiskers, as discussed in the background section above, tin is a metal commonly used in electrical substrates and the majority of problems are caused specifically by tin whiskers. Therefore a coating composition which particularly acts to mitigate tin whisker growth is desirable.

The coating composition may include a layered silicate clay which is a 2:1 clay.

Layered silicate clays may be of 2:1 type or 1:1 type (also known as T-O-T and T-O layered clays, respectively). The ratio refers to the relative numbers of tetrahedral (T) and octahedral (O) sheets in one layer. So, in a 1:1 clay a single layer is made up of one tetrahedral sheet (for example a silica sheet formed of corner-sharing $SiO_4$ tetrahedra), and one octahedral sheet (for example an alumina sheet formed of corner-sharing $AlO_6$ octahedra). In a 2:1 clay, one octahedral sheet is sandwiched between two tetrahedral sheets to form a single clay layer.

When the layered clay used in the coating composition is a 2:1 clay, the intercalation and exfoliation processes which produce the individual clay nanoplatelets are more effective. The break-down of the layered structure into discrete nanoplatelets is more complete and the barrier formed by the embedded nanoplatelets can provide more effective mitigation against whisker growth.

The layered silicate clay of the coating composition may comprise a phyllosilicate clay.

The phyllosilicates are a group of clays including chlorites, dickite, halloysite, illite, kaolinite, hectorite, montmorillonite, nacrite, nontronite, palygorskite, saponite, sepiolite, serpentines and talcs. The layered structure of these clays provides them with the ability to be exfoliated, where separation of the layers leads to discrete nanostructures. Such clays are useful in the present invention for the production of clay nanoplatelets.

Optionally, the layered silicate clay of the coating composition comprises a clay selected from the smectite group of layered silicate clays. These are particularly susceptible to exfoliation by a polymer. Optionally, the layered clay is a 2:1 smectite clay.

The layered silicate clay of the coating composition may comprise a clay selected from montmorillonite, hectorite and saponite.

These three clays form part of the smectite group of layered silicate clays. They are particularly susceptible to exfoliation by a polymer and resultant separation of the clay layers. They are useful for producing the nanoplatelets which form the barrier against whisker growth within the polymer matrix.

The layered silicate of the coating composition may comprise montmorillonite.

The properties of montmorillonite are particularly suited to its application in the present invention, because it undergoes intercalation and exfoliation very effectively to produce a superior dispersion of nanoplatelets within the polymer matrix, enhancing the barrier properties of the conformal coating.

The layered silicate clay may be added to the composition in dry particulate form. The clay may have a typical dry particle size $d_{50}$ of up to 25 μm, for example up to 10 μm.

The clay may be selected from clays marketed, for example under the name Cloisite 15A®, Cloisite 30B® or Cloisite Na⁺®.

The minimum length of the nanoplatelets embedded within the polymer matrix of the coating composition may be at least 50 nm, for example at least 60 nm, 70 nm, 80 nm, 90 nm or 100 nm. This ensures that the nanoplatelets can act as an effective barrier.

The maximum length of the nanoplatelets embedded within the polymer matrix of the coating composition may be up to 1000 nm, for example up to 900 nm, 800 nm, 700 nm, 600 nm, 500 nm, 400 nm, 300 nm or 200 nm.

The length of the nanoplatelets may be up to 400 nm to ensure optical transparency of the coating. However, small amounts of nanoplatelets from 400-1000 nm could still be accommodated ensuring a satisfactory degree of transparency.

Nanoplatelets having a length within this range can cooperate effectively to produce an overlapping or interlocking barrier against whisker growth. The properties of the conformal coating may be optimised by choosing nanoplatelets of specific sizes. Properties such as transparency, flexibility, workability and removability can be affected by the size of the nanoplatelets.

The skilled person would understand that the nanoplatelet size may be tailored by the selection of organoclay and by the extent of exfoliated morphology achieved.

The flexibility of the coating is affected by the selection of base polymer. Thermoplastic polymers are more flexible than thermosetting polymers.

The average aspect ratio of exfoliated nanoplatelets in the coating composition may be up to 1000, for example up to 900, 800, 700, 600 or 500. The average aspect ratio of the nanoplatelets in the coating composition may lie between 200 and 500.

This aspect ratio provides nanoplatelets of suitable dimensions for application as a barrier to whisker growth.

The surface of the nanoplatelets in the coating composition may be functionalised with one or more polar or non-polar functional groups.

The surface of the nanoplatelets in the coating composition may be functionalised with a polar or non-polar group and the base polymer selected such that the clay inter-layer spacing increases by at least 5 nm after exfoliation. More preferably, the spacing increases by at least 10 nm, more preferably at least 15 nm, more preferably at least 20 nm.

In general, a clay inter-layer spacing of at least 5 nm is considered as exfoliation. Where polymer chains are present between clay layers but the spacing has not yet exceeded 5 nm, this is referred to as intercalation.

The polymer matrix may include intercalated and/or exfoliated clay particles. Intercalation alone would offer some inhibition of whisker growth. However, exfoliated nanoplatelets will provide more effective whisker inhibition. Preferably, exfoliation will be achieved during mixing of the coating composition.

Increased separation of the clay layers (also known as "gallery expansion") allows the layers to completely separate into discrete nanoplatelets. The nanoplatelets are then embedded within the polymer matrix in a dispersed arrangement while still exhibiting barrier properties and retaining some overlap between one another. This allows the conformal coating to maintain a degree of transparency and other desirable properties such as workability, while presenting an effective barrier to whisker growth.

Functionalising the surface of the layered silicate clay, and thereby the nanoplatelets, allows compatibility with the particular base polymer used to intercalate and exfoliate the clay. Functionalisation with appropriate compounds can provide the surface of the clay with functional groups which promote intercalation and exfoliation. When the functional groups are compatible with the polymer, intercalation and exfoliation may be achieved.

The non-polar functional groups may be selected from one or more of linear or branched alkyl, cycloalkyl, linear or branched alkenyl, cycloalkenyl, linear or branched alkynyl, aryl or aralkyl.

The non-polar base polymer may be selected from polyethylene, polypropylene or polystyrene. Alternatively, any suitable non-polar polymer or copolymer may be used.

The base polymer may be a polar polymer and the nanoplatelet surfaces may be functionalised with one or more polar functional groups.

Polar functionalised layered silicate clays in combination with a polar base polymer creates compatibility so that the polymer can easily intercalate between the clay layers. This facilitates the formation of nanoplatelets.

The polar functional groups may be selected from one or more of $-OH$, $-OR$, $-NH_2$, $-NHR$, $-NR_2$, $-NO_2$, $-F$, $-Cl$, $-Br$, $-I$, $-CN$, $-COOH$ and $-COOR$, wherein R is selected from linear or branched alkyl (for example $C_{1-4}$ alkyl), phenyl or benzyl or tallow.

The polar base polymer may be selected from polyacrylic acid, polyurethanes, acrylics, silicones, paralenes, epoxies or polyamides.

The surface of the layered silicate clay may be functionalised with substituted quaternary ammonium compound. This may be an ammonium salt of any suitable anion, such as halide. The quaternary ammonium may be substituted with one or more tallow and/or hydrogenated tallow groups.

The quaternary ammonium compound may comprise one or more compounds of the following general formula:

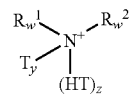

Formula (I)

wherein
$R^1$ and $R^2$ may be the same or different and are each independently selected from linear or branched $C_{1-4}$-alkyl, cycloalkyl, linear or branched $C_{1-4}$-alkenyl, cycloalkenyl, linear or branched $C_{1-4}$-alkynyl, aryl or aralkyl, optionally substituted with one or more groups $R^3$;
T is tallow;
HT is hydrogenated tallow;
w and x are each independently 0, 1, 2 or 3, with the proviso that both w and x cannot be zero;
y and z are each independently 0, 1 or 2, with the proviso that both y and z cannot be zero;
wherein the sum of w, x, y and z is 4; and
$R^3$ is independently selected from
  $C_{1-4}$alkyl, phenyl, benzyl,
  $-OH$, $-OR^4$, $-CF_3$, $-OCF_3$,
  $-NH_2$, $-NHR^4$, $-NR^4_2$, $-NR^5_2$,
  $-CN$, $-NO_2$,
  $-F$, $-Cl$, $-Br$, $-I$,
  $-COOH$ and $-COOR^4$, wherein $R^4$ is selected from linear or branched alkyl (for example $C_{1-4}$alkyl), phenyl or benzyl, and $-NR^5_2$ is independently azetidino, imidazolidino, pyrazolidino, pyrrolidino, piperidino, piperazino, N—$C_{1-4}$alkyl-piperazino, morpholino, azepino or diazepino, optionally substituted with one or more groups selected from linear or branched $C_{1-4}$alkyl, phenyl or benzyl.

In some embodiments, each group-T (tallow) may be the same or different and may be selected from unsaturated $C_{10-20}$alkyl. In some embodiments, -T is unsaturated $C_{14-18}$alkyl. In this context, "unsaturated" means that at least one carbon-carbon double bond is present in the alkyl chain.

In some embodiments, -T represents one or more groups selected from n-octadecenyl, n-hexadecenyl and n-tetradecenyl.

In some embodiments, -T represents n-octadecenyl.
In some embodiments, -T represents n-hexadecenyl.
In some embodiments, -T represents n-tetradecenyl.

In some embodiments, each group -HT (hydrogenated tallow) may be the same or different and may be selected from saturated $C_{10-20}$alkyl. In some embodiments, -HT is saturated $C_{14-18}$alkyl.

In some embodiments, -HT represents one or more groups selected from n-octadecyl, n-hexadecyl and n-tetradecyl.

In some embodiments, -HT represents n-octadecyl.
In some embodiments, -HT represents n-hexadecyl.
In some embodiments, -HT represents n-tetradecyl.

In some embodiments, $R^1$ and $R^2$ are each independently selected from linear or branched $C_{1-4}$alkyl, optionally substituted with one or more groups $R^3$.

In some embodiments, $R^1$ is selected from methyl or ethyl and $R^2$ is selected from methyl or ethyl, optionally substituted with one or more groups $R^3$.

In some embodiments, w and x are each independently 0, 1 or 2, with the proviso that both w and x cannot be zero.

In some embodiments, w is 2 and x is 0. In some embodiments, w is 2 and x is 1.

In some embodiments, y is 1 and z is 0. In some embodiments, y is 0 and z is 2.

In some embodiments, $R^3$ is independently selected from $C_{1-4}$alkyl, phenyl, benzyl,

—OH, —OR$^4$, —CF$_3$, —OCF$_3$,

—F, —Cl, —Br and —I.

In some embodiments, $R^3$ is independently selected from benzyl,

—OH,

—F, —Cl, —Br and —I.

For example, the quaternary ammonium compound may be selected from one or more of dimethyl-dihydrogenated tallow quaternary ammonium (2M2HT), and methyl tallow bis-(2-hydroxyethyl) alkyl quaternary ammonium chloride (MT2EtOH).

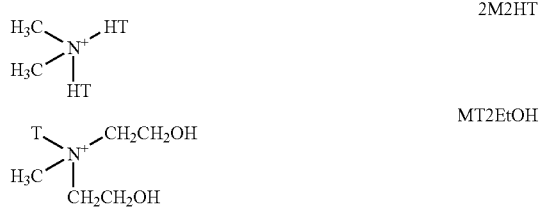

wherein -T and -HT are as defined above.

Where the functional group includes 2M2HT, the base polymer may preferentially be selected to be a non-polar base polymer, for example polyethylene. Layered silicate clays functionalised by 2M2HT may be obtained under the trade name Cloisite 15A®.

Where the functional group includes MT2EtOH, the base polymer may preferentially be selected to be a polar base polymer, for example polyacrylic acid. Layered silicate clays functionalised by MT2EtOH may be obtained under the trade name Cloisite 30B®.

In some preferred embodiments, the functional group includes 2M2HT (for example as used in clays sold under the name Cloisite 15A®) and the base polymer is a urethane polymer. This combination of polymer and functional group provides compatibility and the potential of improved exfoliation of the clay.

The nanoplatelets of the coating composition may be present in the polymer matrix in an amount of at least 0.5 wt %, for example at least 1 wt %, at least 1.5 wt %, at least 2 wt %, at least 2.5 wt %, at least 3 wt %, at least 4 wt %, at least 5 wt % at least 6 wt % or at least 7 wt %. Increasing the loading of nanoplatelets increases both the Young's modulus and yield stress of the coating without jeopardizing the ductility of the coating.

However if the loading is too high the stability of the coating composition may be reduced due to sedimentation of aggregated nanoplatelets and the final coating may have poorer mechanical properties.

To this end, the nanoplatelets of the coating composition may be present in the polymer matrix in an amount of up to 10 wt %, for example up to 9 wt %, up to 8 wt %, up to 7 wt %, up to 6 wt % or up to 5 wt %.

The nanoplatelets of the coating composition may be present in the polymer matrix in an amount of between 0.5 and 10 wt %, for example between 0.5 and 5 wt %.

The amount of nanoplatelets in wt % may be based on the total amount of polymer in the matrix.

Conformal Coating

A fourth aspect of the invention is a conformal coating comprising a coating composition according to any one of the first to third aspects, wherein the nanoplatelets overlap to form a barrier within the polymer matrix.

The coating composition of the invention can be applied to a surface to form a conformal coating. This would usually be a component substrate such as a PCB, or a part of an electronic device. The coating composition can therefore be used to produce a conformal coating which mitigates the growth of whiskers, in particular tin whiskers.

After break-down of the clay particles into tactoids and subsequently into nanoplatelets, exfoliation causes a further break-down into nanoplatelets of reduced dimensions, therefore creating spaces between discrete exfoliated nanoplatelets which originate from the same larger nanoplatelet. The arrangement of nanoplatelets within the polymer matrix prevents these spaces forming a free path for whisker growth through the coating thickness, because the spaces may not be aligned throughout the thickness of the coating.

The barrier of nanoplatelets may lie substantially parallel with the surface of the coating.

"Substantially parallel" indicates that each nanoplatelet lies in a plane which makes an angle with the surface of the coating which is less than 45°, more preferably less than 40°, more preferably less than 35°, more preferably less than 30°, more preferably less than 20°, more preferably less than 10° and most preferably less than 5°.

The extent to which nanoplatelets within the coating are aligned may be affected by the method used to apply the conformal coating to a surface. For example, the conformal coating may be a coating applied to a surface using a drawbar.

The nanoplatelets may all make the same angle with the surface of the coating, or may be to a certain extent randomly oriented, while still being each substantially parallel with the surface, so that the barrier as a whole remains substantially parallel with the surface.

Optionally, at least 50% of the nanoplatelets in the coating, for example at least 55% or at least 60%, make an angle with the plane of the surface of the coating of less than 10°.

Optionally, at least 70% of the nanoplatelets in the coating, for example at least 75% or at least 80%, make an angle with the plane of the surface of the coating of less than 30°.

When the barrier of nanoplatelets lies substantially parallel with the coating surface, the planar surface of the nanoplatelets is presented to any whiskers which grow from the substrate. The whiskers are therefore highly likely to encounter a nanoplatelet as they grow away from the substrate and their growth will be and their further upward movement through the coating at this point largely prevented. Furthermore, since all nanoplatelets may lie in a similar orientation, they produce a much more effective mitigation of whisker growth than when randomly oriented.

The nanoplatelets in the conformal coating may form an interlocked barrier within the polymer matrix.

"Interlocked barrier" indicates that the nanoplatelets overlap to some extent such that they present a barrier across the conformal coating. Such an interlocked barrier arises from the exfoliation step of production of the coating composition. The initial layered silicate clay includes many layers sandwiched together and separated by the "gallery" of usually around 1-4 nm. During exfoliation clay layers become separated from neighbouring layers. An overlapping barrier of nanoplatelets is thereby created.

Such an interlocked barrier is a highly effective way to prevent the growth of whiskers such as tin whiskers through the conformal coating, as no spaces through which whiskers may pass unhindered are available.

The nanoplatelets may be present in the coating in an amount of at least 0.5 wt %, for example at least 1 wt %, at least 1.5 wt %, at least 2 wt %, at least 2.5 wt %, at least 3 wt %, at least 4 wt %, at least 5 wt % at least 6 wt % or at least 7 wt %, based on the coating weight after curing. Increasing the loading of nanoplatelets increases both the Young's modulus and yield stress of the coating without jeopardizing the ductility of the coating.

The nanoplatelets may be present in the coating in an amount of up to 10 wt %, for example up to 9 wt %, up to 8 wt %, up to 7 wt %, up to 6 wt % or up to 5 wt %, based on the coating weight after curing.

The conformal coating may have a thickness of up to 200 μm, for example up to 190 μm, 180 μm, 170 μm, 160 μm, 150 μm, 140 μm, 130 μm, 120 μm, 110 μm.

The conformal coating may have a thickness of up to 100 μm, for example up to 95 μm, 90 μm, 85 μm, 80 μm or 75 μm.

The conformal coating may have a thickness of at least 25 μm, for example at least 30 μm, 35 μm, 40 μm, 45 μm or 50 μm.

The coating can be applied in the thickness range suggested above. The nanoplatelet barrier for a given coating thickness ensures that mitigation of whisker growth is enhanced. This provides a coating with highly desirable properties. The coating is easily applied to a substrate and easily removed so that the underlying device can be inspected or repaired.

The Young's Modulus of the nanocomposite conformal coating is not particularly limited and depends somewhat upon the selection of base polymer and clay concentration in the coating.

Young's Moduli of commonly used polymers include: polyacrylic acid (2-3 GPa), HDPE (0.8-1.0 GPa), LDPE (0.1-0.5 GPa), PU (0.05-1.0 GPa).

The presence of dispersed exfoliated nanoclays within the polymer matrix may increase the Young's Modulus of the conformal coating by 20-60% when nanoparticles are present in an amount of approximately 5 wt %.

The conformal coating may be optically transparent.

"Optically transparent" in this context indicates the presence of sufficient transparency (which may include translucency) to allow the passage of enough visible light so that the nature of underlying structures may be observed.

In this way, the present coating allows for inspection of the underlying substrate or device while the coating is in place. This allows the assessment of the structure of the device and the particular components present.

Electronic Device

A fifth aspect of the invention is an electronic device comprising a substrate with a metallic outer layer, wherein the metallic outer layer is coated with the conformal coating composition according to any one of the first to third aspects.

Growth of whiskers, such as tin whiskers, from the metallic outer layer of the electronic device is precluded by application of the coating composition to form a conformal coating. Therefore, the risk that the device will experience a short circuit due to the bridging of parts by whiskers is significantly reduced, and the reliability and longevity of the device is improved.

The metallic outer layer of the electronic device may comprise tin. Tin is a material often used in electronic devices which is particularly liable to form whiskers. The metallic outer layer may comprise an alloy which includes tin, for example solder.

Method of Producing a Coating Composition

A sixth aspect of the invention is a method of producing a coating composition, comprising (i) adding a layered silicate clay to a base polymer solution; and (ii) mixing the clay into the base polymer and applying shearing forces to the mixture, to form first an intercalated nanocomposite followed by an exfoliated nanocomposite comprising a polymer matrix with embedded clay nanoplatelets.

The shearing forces are preferably applied primarily during the mixing step of the method.

One embodiment of the method may include the steps of
(a) pre-treatment of the nanoclay;
(b) addition of the nanoclay to the polymer;
(c) mixing;
(d) application of shearing forces;
(e) intercalation of the polymer within the clay; and
(f) exfoliation of the clay by the polymer.

Intercalation of the polymer involves the movement of polymer chains into the gallery (inter-layer space) between adjacent clay layers. The gallery widens slightly and as a result the clay swells. The layers of the clay remain associated with one another at this stage due to the bonds between the inner surfaces of adjacent layers. Exfoliation of the clay involves further expansion of the gallery (increase in inter-layer spacing) until the layers separate completely and each layer becomes a discrete nanostructure within the polymer matrix.

This method therefore allows an exfoliated nanocomposite of nanoplatelets embedded within a polymer matrix to be produced. The mixing, intercalation and exfoliation steps lead to a break-down of the clay particles into nanoplatelets. The nanoplatelets are dispersed within the polymer matrix in a barrier-like arrangement because many discrete exfoliated nanoplatelets are produced by the separation of clay layers. As a result of this process the nanoplatelets form a tiled or overlapping barrier to whisker growth. This physical barrier prevents the penetration of whiskers such as tin whiskers through the coating composition when it is applied as a conformal coating.

The method may include a preliminary step of functionalisation of the surface of the layered silicate clay with an organic functional group.

Using a functionalised clay in the coating composition production method provides the benefit that mixing with the polymer is easier, and the intercalation and exfoliation by the polymer is also easier. The functional groups may be polar or non-polar, and the nature of the polymer may be selected to correspond with the type of functional group used such that mixing, intercalation and exfoliation are facile.

The layered silicate clay may be added to the polymer solution in dry particulate form.

Optionally, the method comprises the addition in step (i) of at least 3 wt %, based on the total polymer weight, nanoclay to the polymer solution, for example at least 3.5 wt %, at least 4 wt %, at least 4.5 wt %, at least 5 wt %, at least 5.5 wt %, at least 6 wt %, at least 6.5 wt %, or at least 7 wt %. This provides a conformal coating product with higher Young's modulus and yield stress while maintaining good ductility.

Optionally, the method comprises the further step of pre-swelling the nanoclay in a solvent before adding the nanoclay to the polymer solution (i.e. before step (i)). This pre-swelling step allows a higher loading of nanoclay to be achieved in the coating composition while maintaining good stability of the composition. The higher loading then provides a coating with improved mechanical properties such as higher Young's modulus and yield stress.

The pre-swelling step may be performed by adding the nanoclay to any suitable solvent, optionally an organic solvent. Optionally, any non-polar organophilic solvent is used. Optionally, the solvent is selected from toluene, methyl cyclohexane and xylene. Optionally, the solvent is xylene.

The nanoclay may be added to the base polymer solution to provide an amount of at least 0.5 wt % nanoclay relative to the total amount of polymer in the solution, for example at least 1 wt %, at least 1.5 wt % or at least 2 wt %.

Optionally, the method includes the additional step of sonication of the composition. Optionally, this step is after the mixing and application of shearing forces (i.e. after step (ii)). The sonication step improves the dispersion of the nanoclay in the composition, breaks up agglomerated particulates and enhances the intercalation and exfoliation. Optionally, after sonication further mixing and application of shearing forces steps are performed to complete the intercalation and exfoliation.

A seventh aspect of the invention is a method of forming a conformal coating for the mitigation of growth of whiskers from a metallic surface, comprising applying a coating composition according to any one of the first to third aspects, or a coating composition produced by a method according to the sixth aspect to a metallic surface.

The coating may be applied by spray coating, spin-coating, dip (immersion) application, or brush application.

An eighth aspect of the invention is the use of a coating composition according to any one of the first to third aspects, or a composition produced by a method according to the sixth aspect in the production of a conformal coating for the mitigation of whisker growth from a surface.

The whiskers may be tin whiskers.

A ninth aspect of the invention is a coating composition substantially as described herein, with reference to, and as illustrated in, FIGS. 6, 7 and 8.

A tenth aspect of the invention is a conformal coating substantially as described herein with reference to, and as illustrated in, FIG. 7.

DETAILED DESCRIPTION

Any sub-titles herein are included for convenience only, and are not to be construed as limiting the disclosure in any way.

The invention will now be further described with reference to the following non-limiting Figures and Examples. Other embodiments of the invention will occur to those skilled in the art in the light of these.

The disclosure of all references cited herein, inasmuch as it may be used by those skilled in the art to carry out the invention, is hereby specifically incorporated herein by cross-reference.

Method of Producing a Coating Composition

Figure 1:
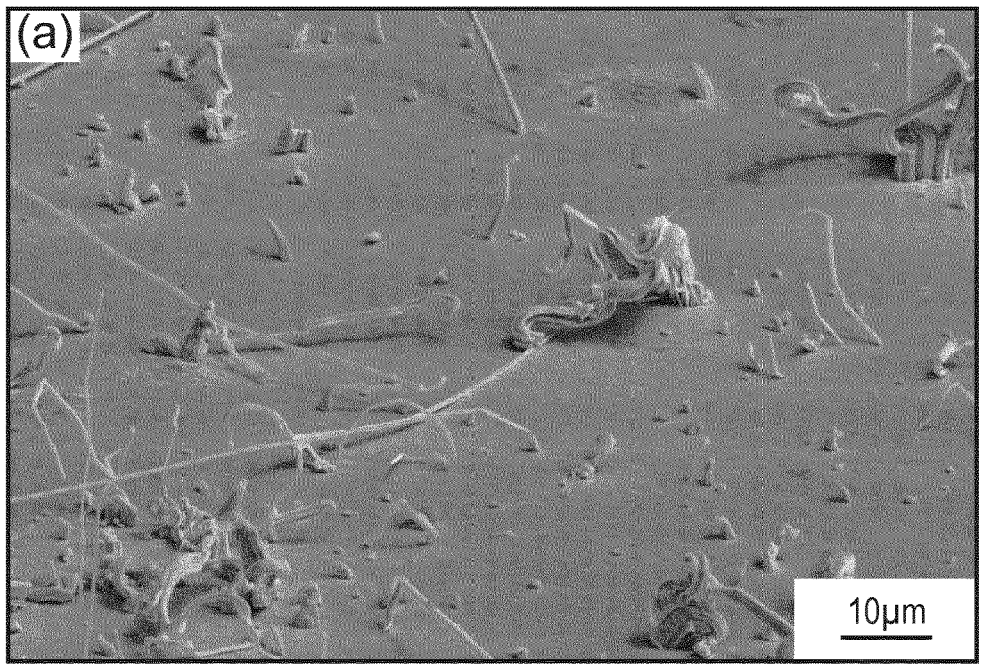
FIG. 1 shows SEM images of tin whiskers emerging from a metallic surface.
Figure 1:
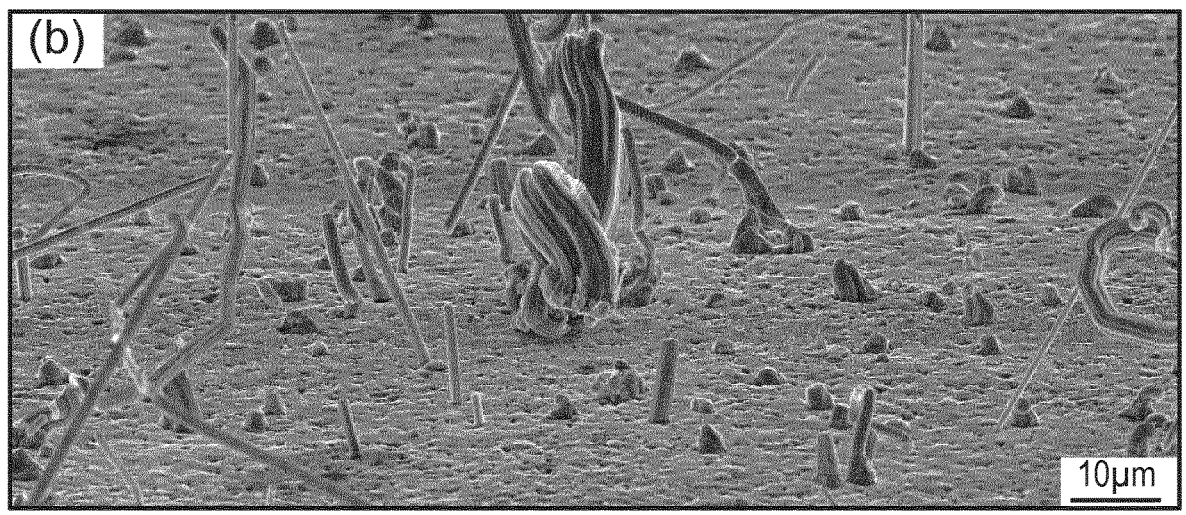
Figure 2:
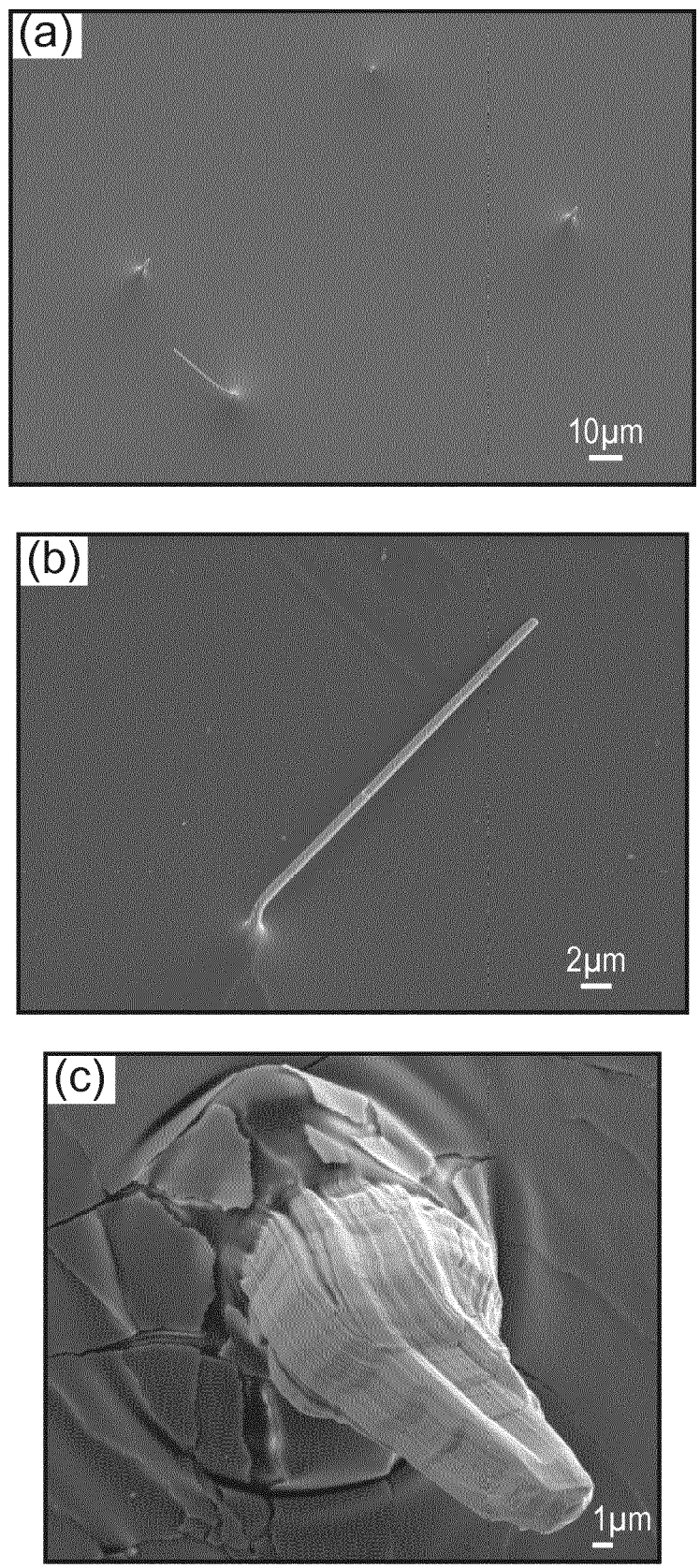
FIG. 2 shows SEM images of tin whiskers growing through a conformal coating.
Figure 3:
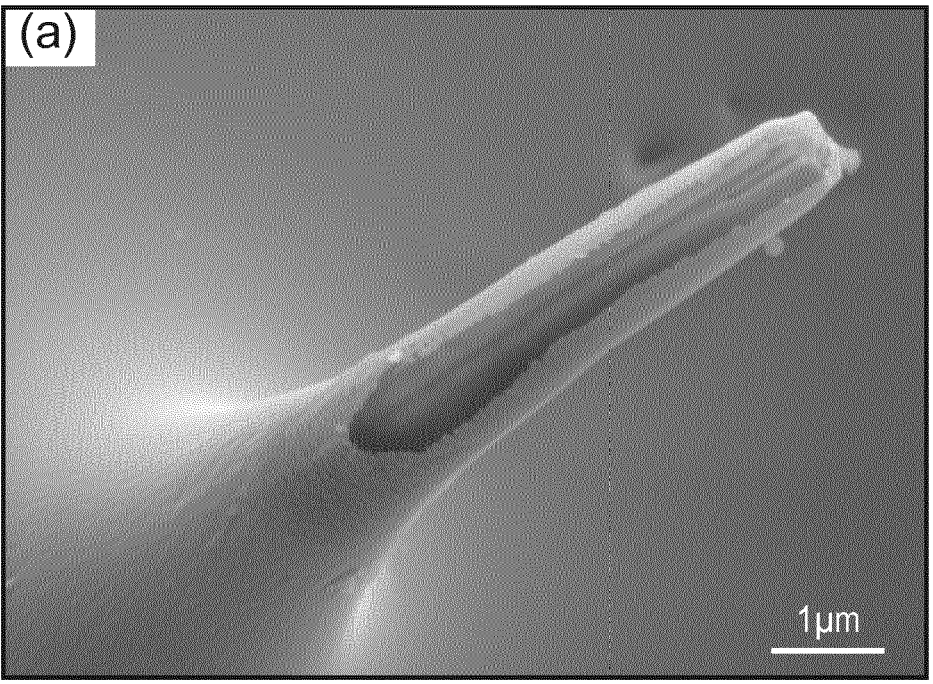
FIG. 3 shows further SEM images of tin whiskers growing through a conformal coating.
Figure 3:
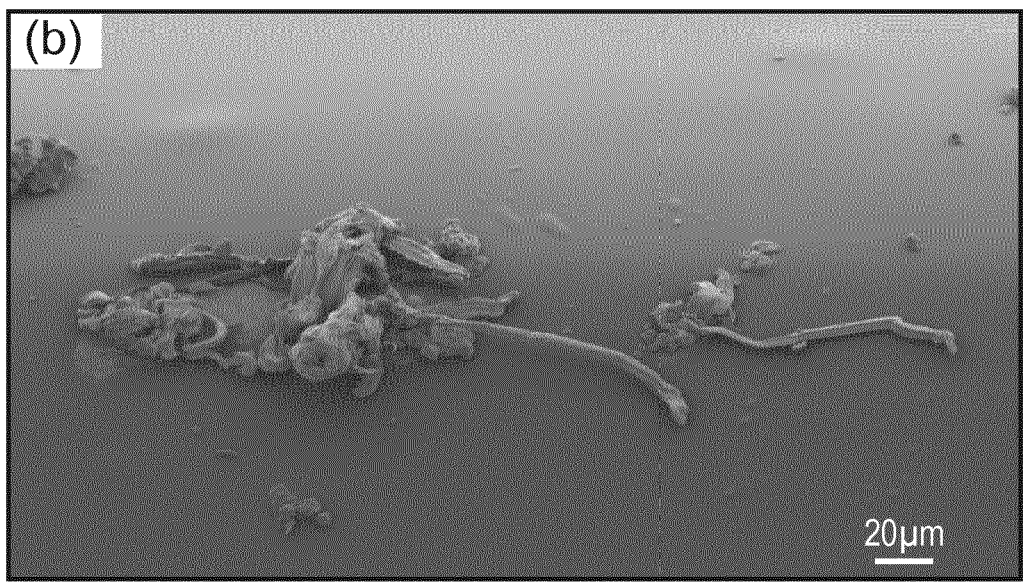
Figure 4:
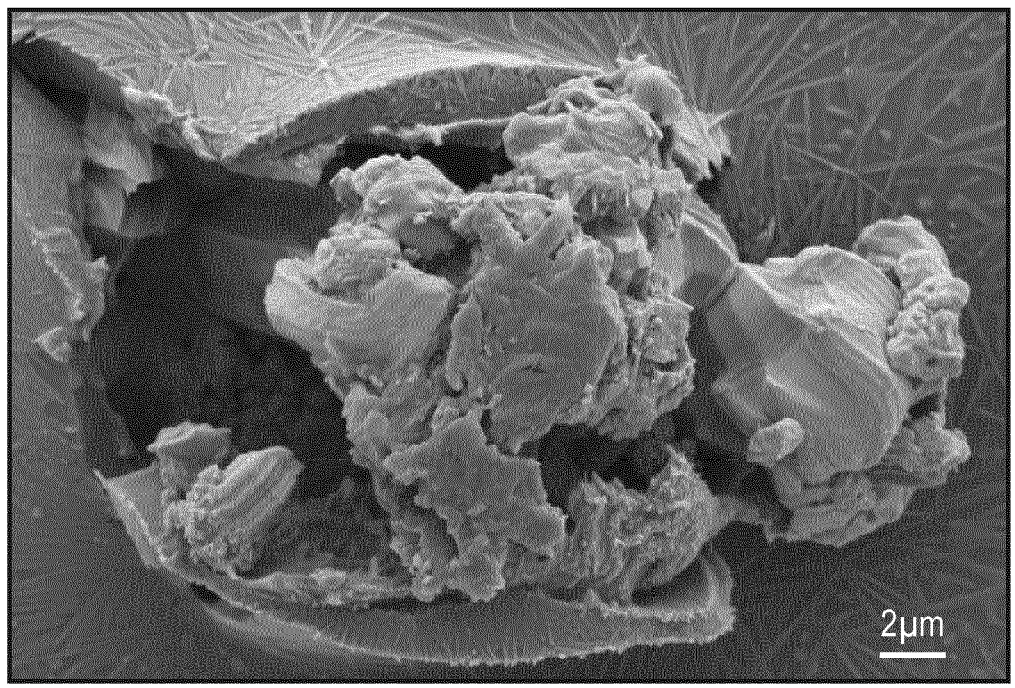
FIG. 4 shows a further SEM image of tin whiskers growing through a conformal coating.
Figure 5:
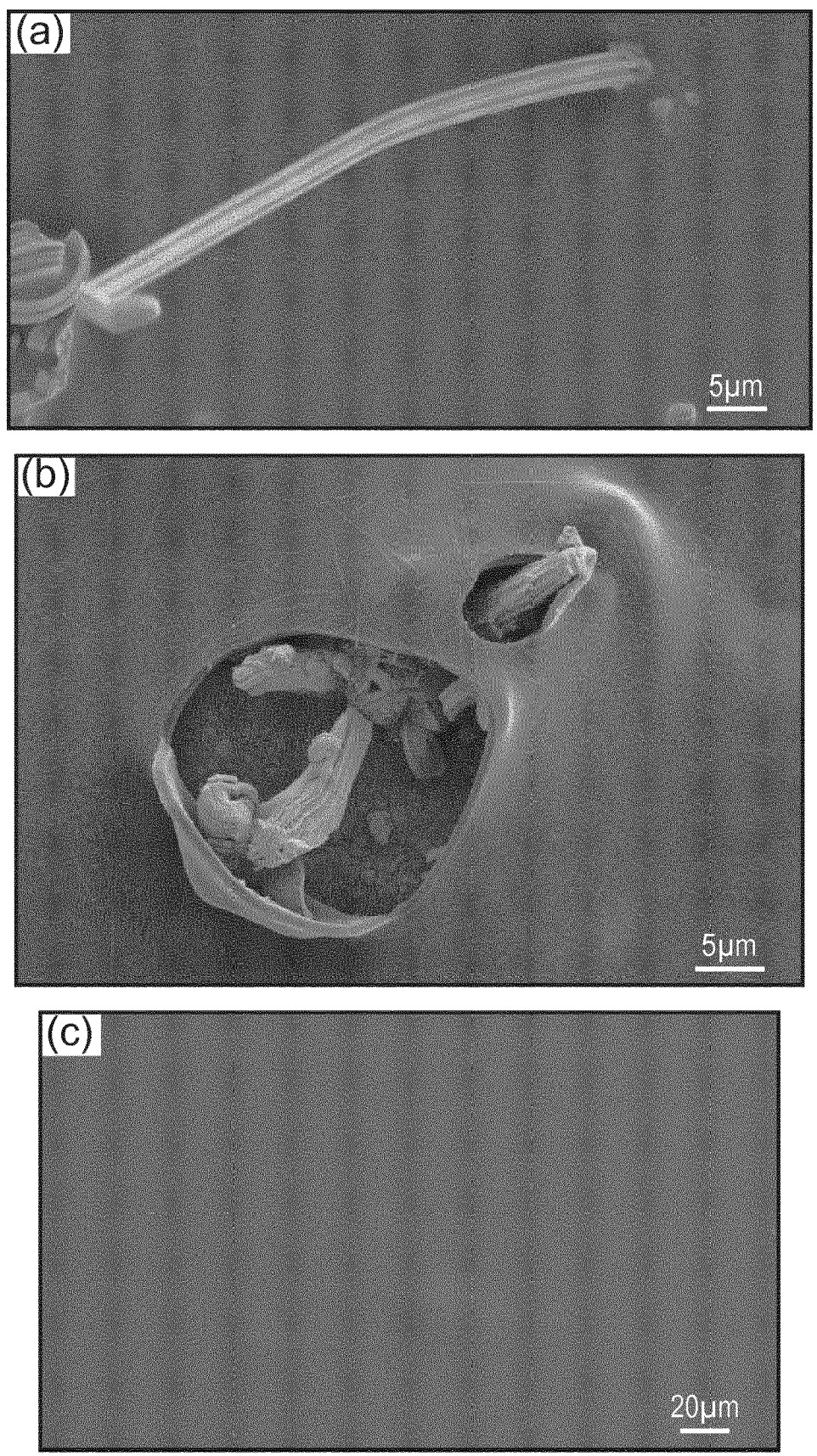
FIG. 5 shows further SEM images of tin whiskers growing through conformal coatings and demonstrates the effect of coating stiffness on the ability of a whisker to penetrate through it (a) very flexible, (b) moderate stiffness and (c) very rigid.
Figure 6:
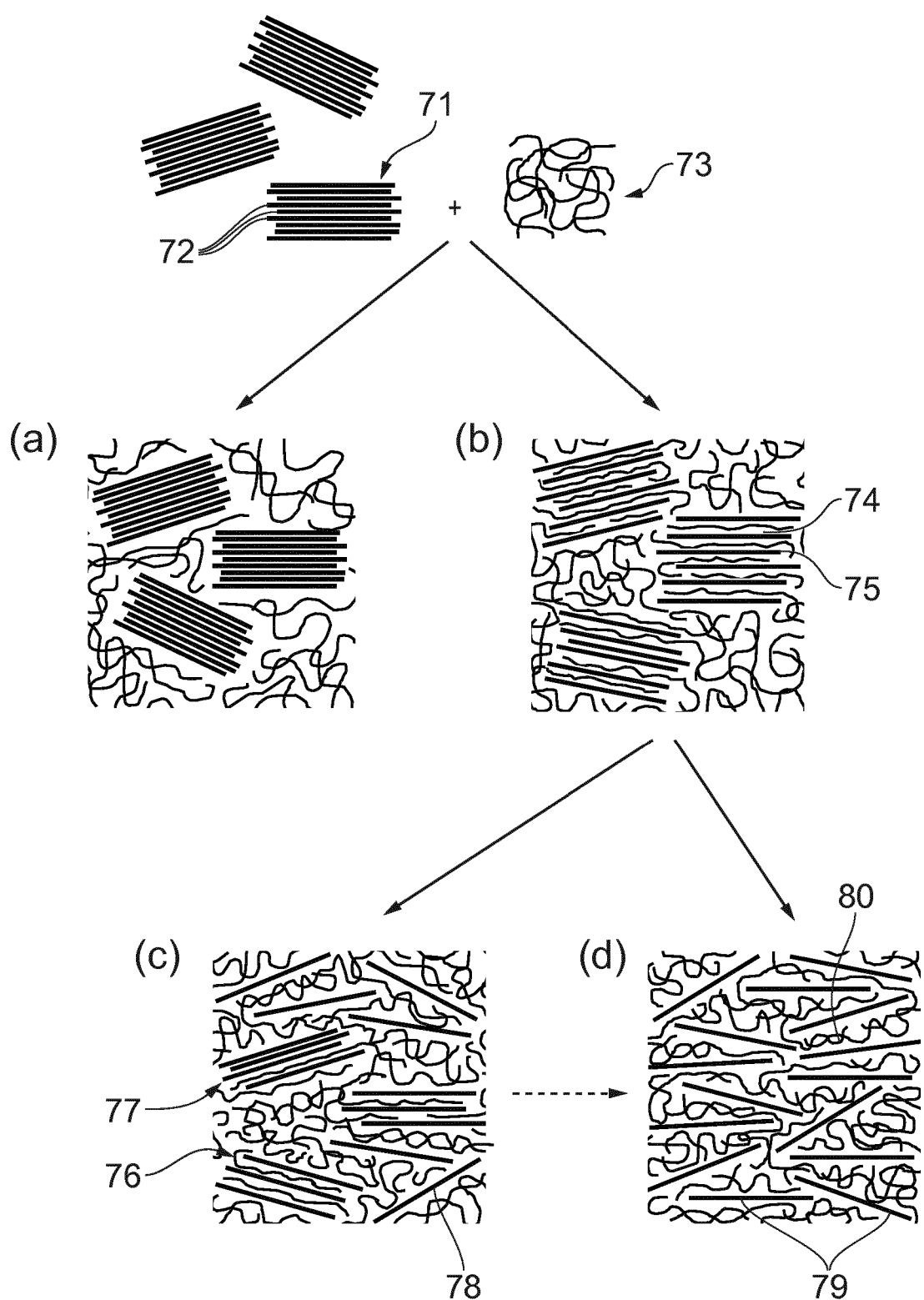
FIG. 6 is a schematic diagram showing the intercalation and exfoliation processes for layered silicate clays.

FIG. 6 depicts a schematic representation of a process according to the present invention for the production of a coating composition which is suitable for use as a conformal coating on a surface prone to whisker growth.

A layered silicate clay 71 is made up of individual layers 72. The clay may be a 1:1 clay or a 2:1 clay. Where the clay is a 1:1 clay, each layer 72 includes a tetrahedral sheet and an octahedral sheet. Where the clay is a 2:1 clay, each layer 72 includes an octahedral sheet sandwiched between two tetrahedral sheets.

The layered clay in FIG. 6 consists of individual "bundles" or "tactoids", of which three are shown in FIG. 6. The layers 72 within each individual tactoid are all parallel with each other. However, the tactoids themselves may not be parallel with each other, as shown in the figure.

Counter cations (not shown) are intercalated between layers 72. These may be any suitable cation, for example alkali metal cations, alkaline earth metal cations or transition metal cations.

The surfaces of the clay layers, especially those internal surfaces adjacent to the cations, may be functionalised with organic functional groups. These may be polar or non-polar.

The first step of the process involves mixing the layered clay, in particulate form, into a solution of base polymer 73. The base polymer 73 may be a single polymer or copolymer, or a mixture of polymers and/or copolymers. This step provides an initial phase-separated microcomposite as shown in FIG. 6(*a*). At this stage, polymer chains have not yet moved into the space between clay layers.

Once the clay 71 has been added to the polymer solution, shearing forces are applied with a mixer using a suitable blade or paddle to promote the interactions between the clay 71 and the polymer 73, primarily through hydrogen bonding. To further promote such interactions, a compatible clay/polymer combination is chosen. For example, where a clay functionalised with polar organic groups is used, a corresponding polar polymer or mixture of polar polymers will be used. Alternatively a clay functionalised with non-polar organic functional groups may be used, in which case a corresponding non-polar polymer or mixture of non-polar polymers is selected.

The polymer 73 then becomes intercalated between layers 72 of the clay tactoid, in a process known as intercalation. The inter-layer spacing of the clay (the distance between two adjacent layers) increases and the gallery 74 widens. At this stage the individual layers 75 are still associated with each other and are not yet distinct. The tactoid may become intercalated equally and evenly, or in a random arrangement, as shown in FIG. 6(b). The result in each case is an intercalated nanocomposite.

Prior to, or as an alternative to, attaining a fully exfoliated morphology a nanocomposite comprising fully intercalated nanoplatelets 76, partially intercalated nanoplatelets 77 and discrete exfoliated nanoplatelets 78 may be achieved, as shown in FIG. 6(c).

As intercalation by the polymer continues, the forces holding adjacent layers of clay together weaken and the gallery 74 widens further. Eventually, exfoliation of the clay occurs and the layers become completely separate forming discrete nanoplatelets comprised of a single clay layer 79 dispersed within a polymer matrix 80. A fully exfoliated nanocomposite is produced, as shown in FIG. 6(d).

Once the nanoplatelets are fully exfoliated they lose their regular structure that is apparent following intercalation. Depending on the application method used, they will retain some orientation or alignment. However, more importantly the nanoplatelets will present a significant degree of overlap meaning that whisker mitigation is more likely.

Conformal Coating

Figure 7:
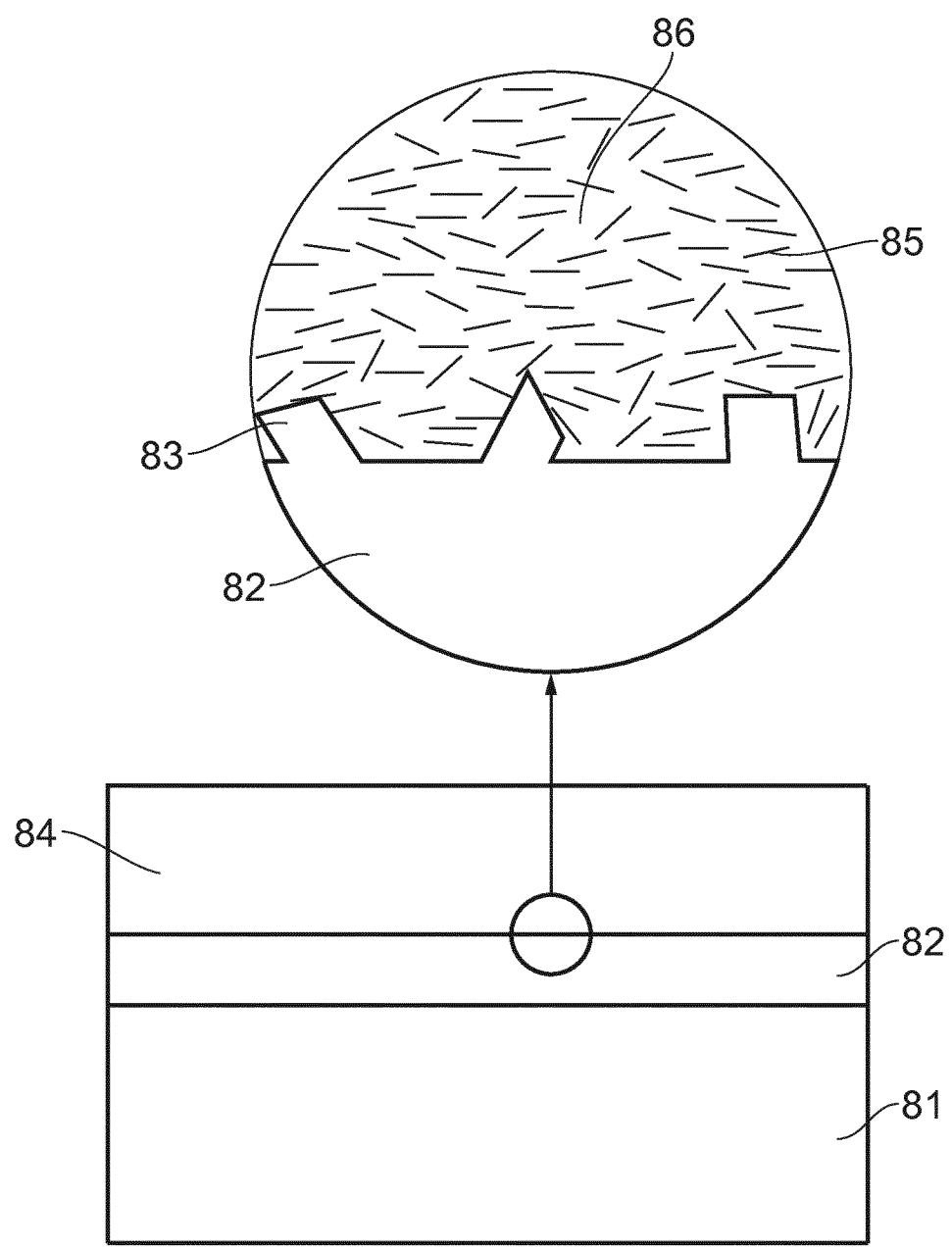
FIG. 7 is an idealized diagram of a substrate and metallic surface with a clay nanoplatelet containing conformal coating applied.

FIG. 7 shows the coating composition from FIG. 6(c) applied as a conformal coating to a substrate.

The substrate 81 may be any part of an electrical device upon which a metallic layer is deposited. In FIG. 7, PCB 81 has a tin outer layer 82, which is magnified in the upper part of the Figure. Tin whiskers 83 grow spontaneously from the outer surface of the tin layer, and may cause problems such as short circuits and device failure.

The conformal coating 84 is applied to the tin outer layer 82. The conformal coating is made from the nanocomposite shown in FIG. 6 including the polymer matrix 86 and clay nanoplatelets 85 embedded therein. The coating is applied to the tin outer surface by dip (immersion) coating, but may also be applied by spray coating or brush coating. Ideally the nanoplatelets are fully exfoliated and oriented within planes substantially parallel to the surface of the conformal coating (and therefore also parallel with the surface of tin outer layer 82). The nanoplatelets 85 therefore form a highly effective physical barrier to growth of tin whiskers 83 through the conformal coating 84. As a result, tin whisker growth is mitigated and the device is effectively protected. Furthermore, the physical characteristics required of a conformal coating are not compromised.

As shown in FIG. 7, the orientation of the nanoplatelets in the coating 84 is somewhat random in that not all nanoplatelets lie parallel to the same plane. The nanoplatelets retain some orientation from the method of coating application. The nanoplatelets present an overlapping structure which presents an effective barrier to the tin whiskers.

Figure 8:
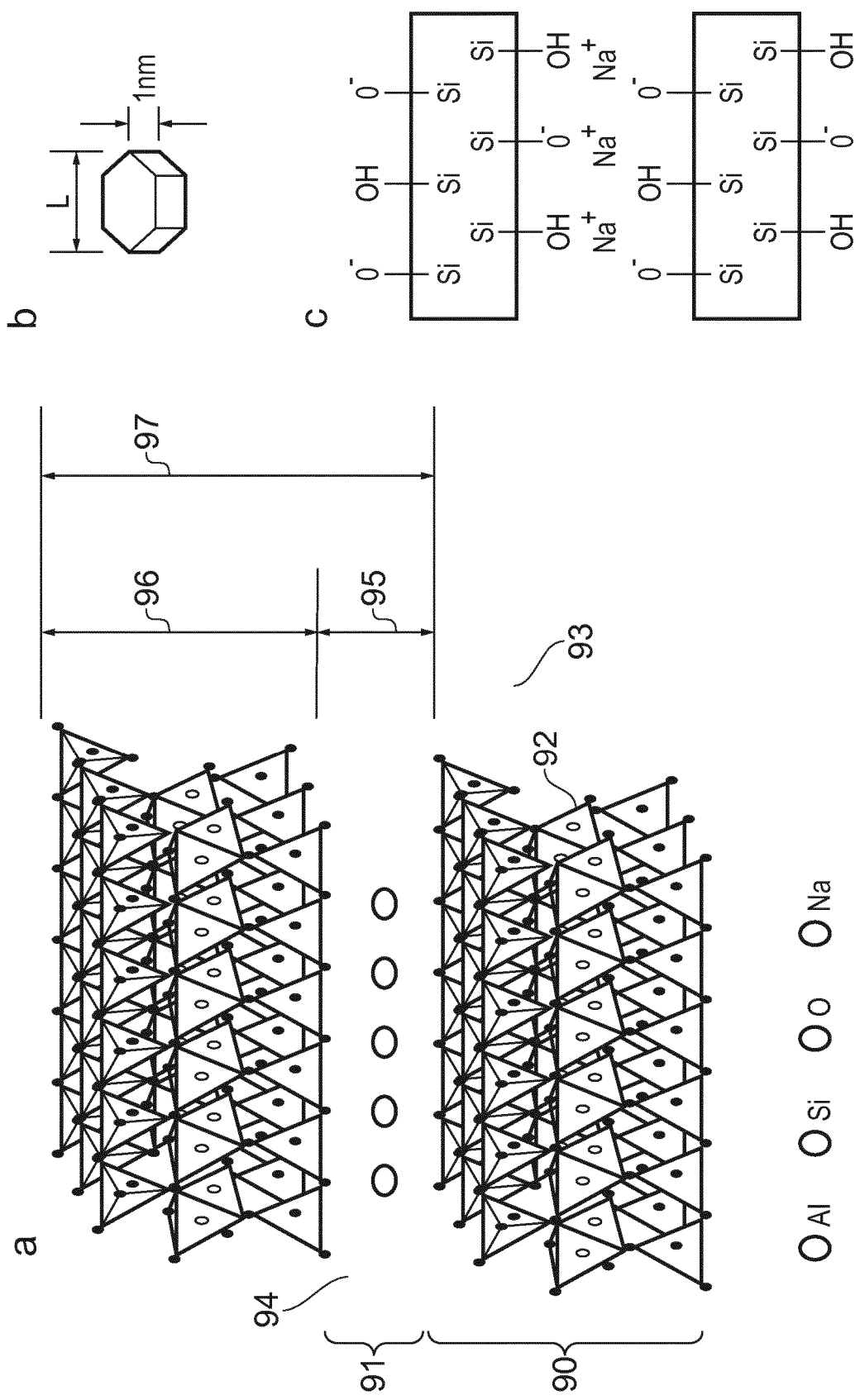
FIG. 8 is a schematic diagram showing the structure of montmorillonite, a layered silicate clay.

FIG. 8(a) shows the chemical structure of montmorillonite, a layered silicate clay which may be used to form the nanocomposite coating composition of the present invention.

Montmorillonite is a 2:1 clay consisting of clay layers 90 separated by the inter-layer gallery 91. Each layer is comprised of two silica tetrahedra fused to an edge-shared octahedral sheet of either aluminium or magnesium hydroxide. Isomorphic substitution within the layers generates negative charges that are normally counterbalanced by sodium ions 94 intercalated between any two adjacent layers, within the gallery.

The inter-layer spacing 95 is 1.17 nm. The clay is also characterised by layer thickness 96 and basal spacing 97.

The thickness of the 2:1 layer 96 is approximately 0.94-0.96 nm. The size of the inter-layer space 95 is dependent on the radius of the counterbalancing cation, the negative charge density in the layers and hydration of the counterbalancing cation, which is in the range of 0.02-0.25 nm. Hence, the basal spacing 97 is between 0.96 nm and 1.21 nm.

FIG. 8(b) shows an exfoliated nanoplatelet formed from a montmorillonite clay by exfoliation with a polymer. The nanoplatelet in FIG. 8(b) has a thickness of 1 nm. The length of the nanoplatelet depends upon clay selection. FIG. 8(c) shows another representation of the layered clay structure. The clay surfaces are functionalised with hydroxy groups, some of which are deprotonated. To balance the overall charge of the clay, sodium ions are present within the gallery between the layers. The functionalisation allows for dispersion into and miscibility with the polymer matrix.

As a result, the nanoplatelets produced from the clay are also functionalised with polar hydroxy functional groups. This is achieved by using a pre-functionalised clay.

EXAMPLES

Clay Compositions

A number of clays were used to produce nanocomposite materials. Table 1 below summarises the clays used.

TABLE 1

| Clay | Moisture/% | Typical Dry Particle Size ($d_{50}$)/μm | Colour | Packed Bulk Density/g/l | Density/ g/cm | $d_{001}$ (X-ray results)/ nm |
|---|---|---|---|---|---|---|
| Cloisite 15A | <2 | <10 | Off white | 299 | 1.66 | 3.15 |
| Cloisite 30B | <3 | <10 | Off white | 365 | 1.98 | 1.85 |

The clays were obtained from BYK Additives & Instruments.

Cloisite 15A® is dimethyl, dihydrogenated tallow quaternary ammonium with bentonite. Cloisite 30B® is alkyl quaternary ammonium salt bentonite.

The clays are surface modified with an organic chemistry to allow complete dispersion into and provide miscibility with the polymer matrix systems such as Cloisite 15A®: 2M2HT, dimethyl dihydrogenated tallow onium ion, d-spacing: 3.15 nm, where HT is Hydrogenated Tallow (~65% C18; ~30% C16; ~5% C14) and Cloisite 30B®: MT2EtOH methyl tallow bis-(2-hydroxyethyl) alkyl quaternary ammonium chloride. D-spacing=1.85 nm, where T is Tallow (~65% C18; ~30% C16; ~5% C14).

Depending on the characteristics of the polymers used (e.g. polar or non-polar, the types of polar groups in the polymer chains), different nanoclays and organic modified clays were added into the polymer solutions (coatings) to achieve the exfoliation by applying shearing forces to promote the interactions between the clays and polymers mainly through hydrogen bonds.

Example 1: Direct Addition of Nanoclay (15A) to Urethane Based Polymer 0.6 g of Cloisite 15A nanoclay was added to 50 g of urethane based polymer, with a solids content of 40%, and mixed using an overhead stirrer fitted with a high shear mixing blade for 90 min at 750 rpm. The resultant cured polymer-nanoclay composite had a nanoclay content of 3 wt %.

Example 1A: Direct Addition of Nanoclay (15A) to Urethane Based Polymer 0.4 g of Cloisite 15A nanoclay was added to 50 g of urethane based polymer, with a solids content of 40%, and mixed using an overhead stirrer fitted with a high shear mixing blade for 90 min at 750 rpm. After curing at 80° C. in an oven for 1 hour, the resultant cured polymer-nanoclay composite had a nanoclay content of approximately 2 wt %.

Figure 9:
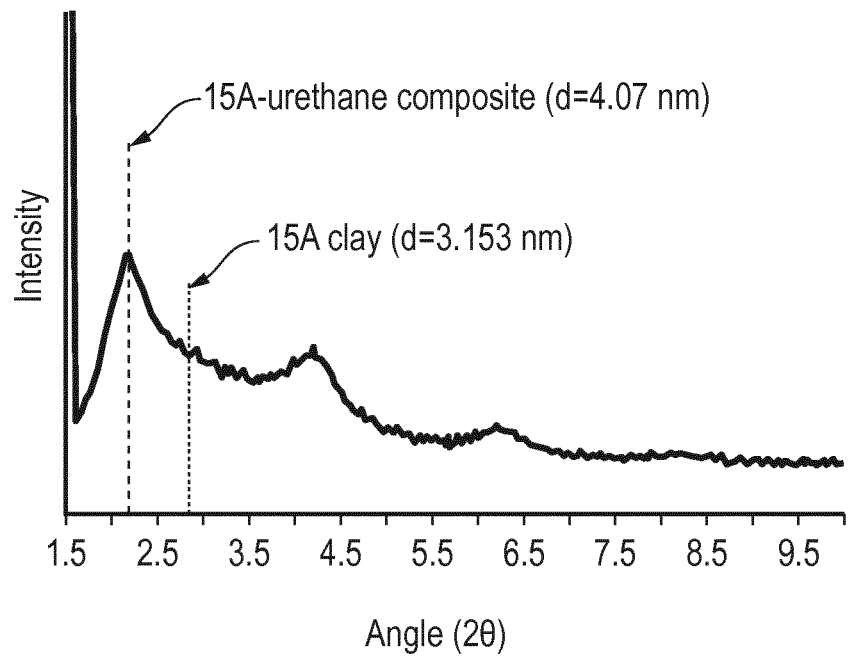
FIG. 9 is an X-ray diffraction pattern for 2 wt % Cloisite 15A-urethane polymer composite material formed by direct clay addition to the polymer.
Figure 10:
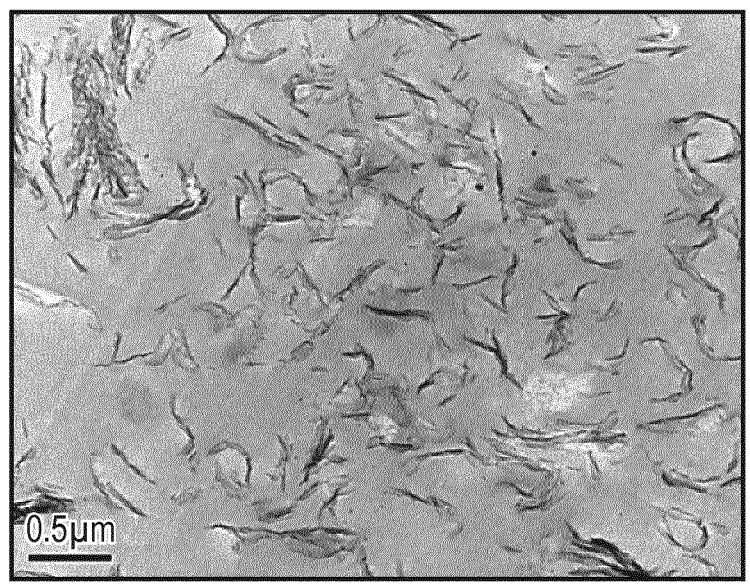
FIG. 10 is a transmission electron micrograph showing well-dispersed Cloisite 15A nanoclay platelets in a 2 wt % 15A-urethane polymer composite.

X-ray diffraction (XRD) measurements on the cured composite material (an example of which is shown in FIG. 9) demonstrated that the interlayer spacing of the nanoclay had increased in the composite relative to that of the clay (4.07 nm compared with 3.153 nm), which indicates that intercalation of the clay by the polymer has occurred and a nanocomposite material has been formed. This was confirmed by transmission electron microscope (TEM) investigations (FIG. 10) which also show that the clay nanoplatelets are well dispersed in the composite material.

Although stable polymer-clay mixes can be achieved for loadings up to approximately 2 wt %, mixes with higher clay loadings were shown to be unstable and liable to sedimentation. The stability of the polymer-nanoclay mixture can be improved for higher clay loadings by pre-swelling in a suitable solvent.

Example 2: Pre-Swell Nanoclay (15A) in Solvent (Xylene) Prior to Adding to Urethane Based Polymer The first stage was to pre-swell the nanoclay in solvent. 0.9 g of Cloisite 15A nanoclay was added gradually to 20 g of xylene at a rate of 0.1 g/30 min. Subsequently, the pre-swelled clay mixture was added to 60 g of urethane polymer, with a solids content of 50%, and mixed using an overhead stirrer fitted with a high shear mixing blade for 90 min at 750 rpm. The resultant cured polymer-nanoclay composite had a nanoclay content of 3 wt %.

Example 2A: Pre-Swell Nanoclay (15A) in Solvent (Xylene) Prior to Adding to Urethane Based Polymer The first stage was to pre-swell the nanoclay in solvent. 0.9 g of Cloisite 15A nanoclay was added gradually to 20 g of xylene at a rate of 0.1 g/30 min. Subsequently, the pre-swelled clay mixture was added to 60 g of urethane-based polymer, with a solids content of 50%, and mixed using an overhead stirrer fitted with a high shear mixing blade for 90 min at 750 rpm. After curing at 80° C. in an oven for 1 hour, the resultant cured polymer-nanoclay composite had a nanoclay content of approximately 3 wt %.

After mixing the composite mixture was cast into approximately 10 cm×10 cm sheets and test samples were prepared to investigate the mechanical properties of the 15A nanoclay modified composite material. Dynamic mechanical analysis (DMA) was performed on the cured material using a TA Instruments Q800 DMA system operating in dual cantilever mode. Storage modulus values at a range of temperatures are shown in Table 2 for a 3 wt % 15A nanoclay composite material and compared with values obtained from unmodified urethane control samples. The results clearly demonstrate that the clay additions bring about a significant increase in the storage modulus of the material.

TABLE 2

Comparison of storage modulus values obtained from unmodified and 3 wt % 15A modified urethane materials at different temperatures

| Test temperature (° C.) | Average Storage modulus (MPa) | | |
|---|---|---|---|
| | Unmodified urethane | Urethane modified with 3 wt % 15A | % change in modulus |
| 30 | 581 ± 41 | 886 ± 122 | +52% |
| 40 | 280 ± 9 | 466 ± 46 | +66% |
| 50 | 78 ± 5 | 174 ± 13 | +123% |

Further improvements in mechanical properties were achieved by increasing the clay content in the composite. This is demonstrated in Table 3, which shows data obtained for a 7 wt % 15A nanoclay-urethane composite material, fabricated in the same manner as the 3 wt % 15A material described above.

TABLE 3

Comparison of storage modulus values obtained from unmodified and 7 wt % 15A modified urethane materials at different temperatures

| Test temperature (° C.) | Average Storage modulus (MPa) | | |
|---|---|---|---|
| | Unmodified urethane | Urethane modified with 7 wt % 15A | % change in modulus |
| 30 | 769 ± 188 | 1836 ± 361 | +139% |
| 40 | 451 ± 122 | 1123 ± 164 | +149% |
| 50 | 160 ± 39 | 479 ± 61 | +199% |
| 60 | 42 ± 11 | 151 ± 55 | +260% |

Example 3: Addition of Nanoclay (30B) to Acrylic Based Polymer with the Incorporation of Ultrasound In this method, sonication was used to improve dispersion of the nanoclay, break up agglomerated particulates and potentially enhance intercalation/exfoliation. 0.9 g of Cloisite 30B nanoclay was added to 100 g of an acrylic based polymer with a solids content of 30%. This was then mixed for 30 min at 500 rpm using an overhead stirrer fitted with a high shear mixing blade to uniformly distribute the clay within the polymer. After mixing, sonication was then applied using a Misonix Sonicator 4000. Sonication was performed in pulsed mode using an amplitude of 25% with a 10 s off and 10 s on pulse duration. The total sonication time was 20 min. After sonication, the polymer-nanoclay mixture was further mixed using an overhead stirrer fitted with a high shear mixing blade for 30 min at 500 rpm. After processing, the solids content of the polymer-nanoclay mixture had increased to 34% due to solvent evaporating during mixing and sonication. The resultant cured polymer-nanoclay composite has a nanoclay content of 3 wt %.

Example 3A: Addition of Pre-Swollen Nanoclay (30B) to Acrylic Based Polymer with the Incorporation of Ultrasound In this method, sonication was used to improve dispersion of the nanoclay, break up agglomerated particulates and potentially enhance intercalation/exfoliation. 0.9 g of Cloisite 30B nanoclay was initially pre-swollen in 10 g of solvent in 0.1 g steps. This was subsequently added to 100 g of an acrylic based polymer with a solids content of 30%. This was then mixed for 30 min at 500 rpm using an overhead stirrer fitted with a high shear mixing blade to uniformly distribute the clay within the polymer. After mixing, sonication was then applied using a Misonix Sonicator 4000. Sonication was performed in pulsed mode using an amplitude of 25% with a 10 s off and 10 s on pulse duration. The total sonication time was 20 min. After sonication, the polymer-nanoclay mixture was further mixed using an overhead stirrer fitted with a high shear mixing blade for 30 min at 500 rpm. After processing, the solids content of the polymer-nanoclay mixture had increased to 34% due to solvent evaporating during mixing and sonication. After curing at 80° C. in an oven for 1 hour, the resultant cured polymer-nanoclay composite has a nanoclay content of approximately 3 wt %.

Composite materials prepared using this method demonstrated significantly improved properties compared with the unmodified base material. Table 4 shows DMA test data for a 3 wt % 30B modified acrylic material. It is evident that the addition of the nanoclay resulted in a significant improvement in storage modulus.

TABLE 4

Comparison of storage modulus values obtained from unmodified and 3 wt % 30B modified acrylic materials at different temperatures

| Test temperature (° C.) | Average Storage modulus (MPa) | | % change in modulus |
|---|---|---|---|
| | Unmodified acrylic | Acrylic modified with 3 wt % 30B | |
| 30 | 1222 ± 166 | 2067 ± 202 | +69% |
| 40 | 1282 ± 138 | 2248 ± 94 | +75% |
| 50 | 599 ± 107 | 1117 ± 58 | +86% |

Example 4: Orientation of Nanoplatelets within the Nanocomposite Film

Figure 11:
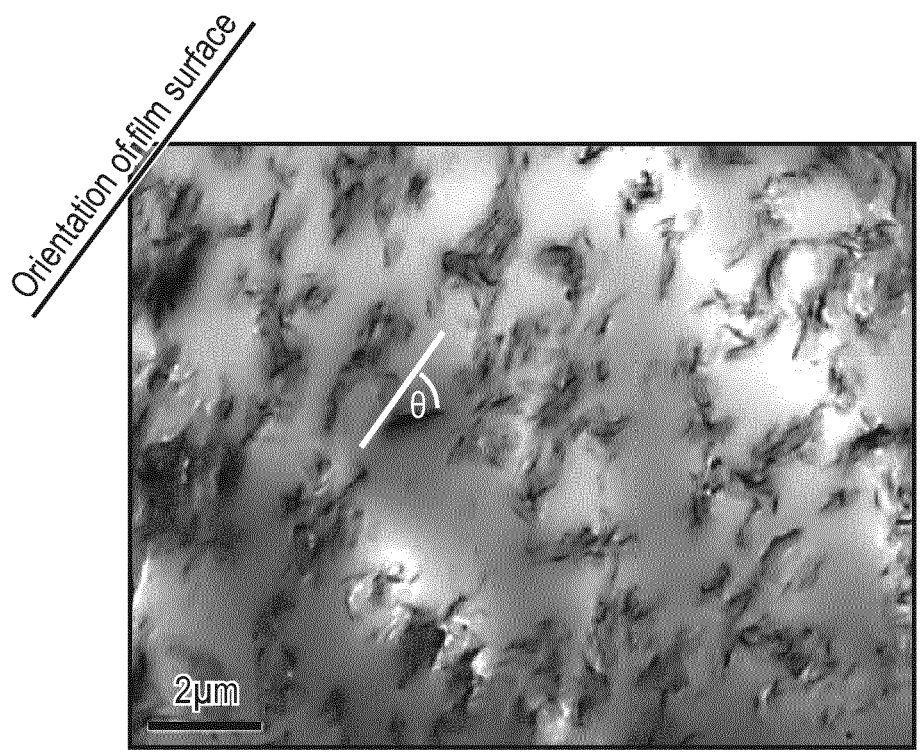
FIG. 11 is a TEM image showing the distribution and orientation of nanoplatelets in a 2 wt % 15A-acrylic polymer nanocomposite film prepared by dip coating.

The Orientation of the Nanoplatelets with Respect to the Coating Surface was Investigated using transmission electron microscopy (TEM). A nanocomposite-acrylic mixture having a content of 2 wt % 15A was initially prepared by pre-swelling the clay in xylene and subsequently incorporating into an acrylic polymer using an overhead stirrer, equipped with a high shear mixing blade, at 750 rpm for 1 h. A nanocomposite film was then prepared using a dip coating method. To facilitate identification of the surface of the coating in the TEM, a thin film of Au/Pd was sputter deposited onto the surface of the nanocomposite. Samples of the resultant film were then cross-sectioned using an ultramicrotome to produce samples suitable for TEM analysis. Results show that the 15A clay is well dispersed within the polymer matrix (FIG. 11). Furthermore, analyses suggest that the clay nanoplatelets are, to a certain extent, oriented in a direction that is noticeably aligned relative to the surface of the coating (the orientation of which is indicated in FIG. 11). Table 5 shows the percentage of clay nanoplatelets that deviate by a given angle ($\theta$) from the surface of the nanocomposite film. Results indicate that approximately 60% of the nanoplatelets are aligned at an angle of less than 10° relative to the surface of the coating and over 80% of the nanoplatelets are aligned at an angle of less than 30° relative to the surface of the coating.

TABLE 5

The percentage of clay nanoplatelets that deviate by a given angle ($\theta$) from the surface of the nanocomposite film

| Deviation angle $\theta$ from plane of coating surface (°) | Nanoplatelets (%) |
|---|---|
| <10 | 61 |
| <20 | 75 |
| <30 | 83 |
| <40 | 86 |
| <50 | 90 |
| <60 | 94 |
| <70 | 96 |
| <80 | 97 |
| <90 | 100 |

Example 5: Addition of Pre-Swollen Nanoclay (15A) to Acrylic Based Polymer 15A nanoclay-acrylic polymers were fabricated utilising the pre-swelling technique outlined in Examples 2 and 2A. For example, 0.9 g of 15A nanoclay was pre-swollen in 40 g of xylene and subsequently added to 60 g of acrylic polymer with a solids content of 50%. The mixture was then stirred using an overhead mixer fitted with a high shear mixing blade at 750 rpm for 1 h. After curing at 80° C. in an oven for 1 hour, the resultant cured polymer-nanoclay composite has a nanoclay content of approximately 3 wt %.

Table 6 shows the effect on average storage modulus of 3 wt % 15A additions to an acrylic coating material. The results show that storage modulus is significantly improved by the addition of 3 wt % 15A nanoclay.

TABLE 6

Comparison of storage modulus values obtained from unmodified and 3 wt % 15A modified acrylic materials at different temperatures

| Test temperature (° C.) | Average Storage modulus (MPa) | | |
|---|---|---|---|
| | Unmodified acrylic | Acrylic modified with 3 wt % 15A | % change in modulus |
| 30 | 572 ± 45 | 876 ± 105 | +53% |
| 40 | 152 ± 28 | 255 ± 30 | +67% |
| 50 | 51 ± 9 | 85 ± 11 | +65% |

The effect of clay content on the mechanical properties of nanoclay modified coating material has been further investigated by a programme of tensile testing. For these trials acrylic polymers with clay loadings of 3 wt %, 5 wt % and 7 wt % were investigated. Average values for Young's modulus, yield stress and % elongation at failure as a function of clay content are shown in Table 7.

TABLE 7

The effect of clay content on the mechanical properties of 15A modified acrylic coatings

| Property | Unmodified acrylic | 3 wt % 15A modified acrylic | 5 wt % 15A modified acrylic | 7 wt % 15A modified acrylic |
|---|---|---|---|---|
| Young's modulus (MPa) | 149 ± 17 | 165 ± 31 | 187 ± 30 | 216 ± 13 |
| Yield stress (MPa) | 2.63 ± 0.15 | 3.02 ± 0.14 | 3.45 ± 0.14 | 4.03 ± 0.17 |
| % elongation at failure | 422 ± 8 | 417 ± 16 | 425 ± 5 | 399 ± 6 |

Results show that there is a gradual increase in both Young's modulus and yield stress as the clay content is increased. Importantly, results indicate that there is no significant loss in ductility even for a clay loading of 7 wt %.

Evaluation of Whisker Mitigation

Figure 12:
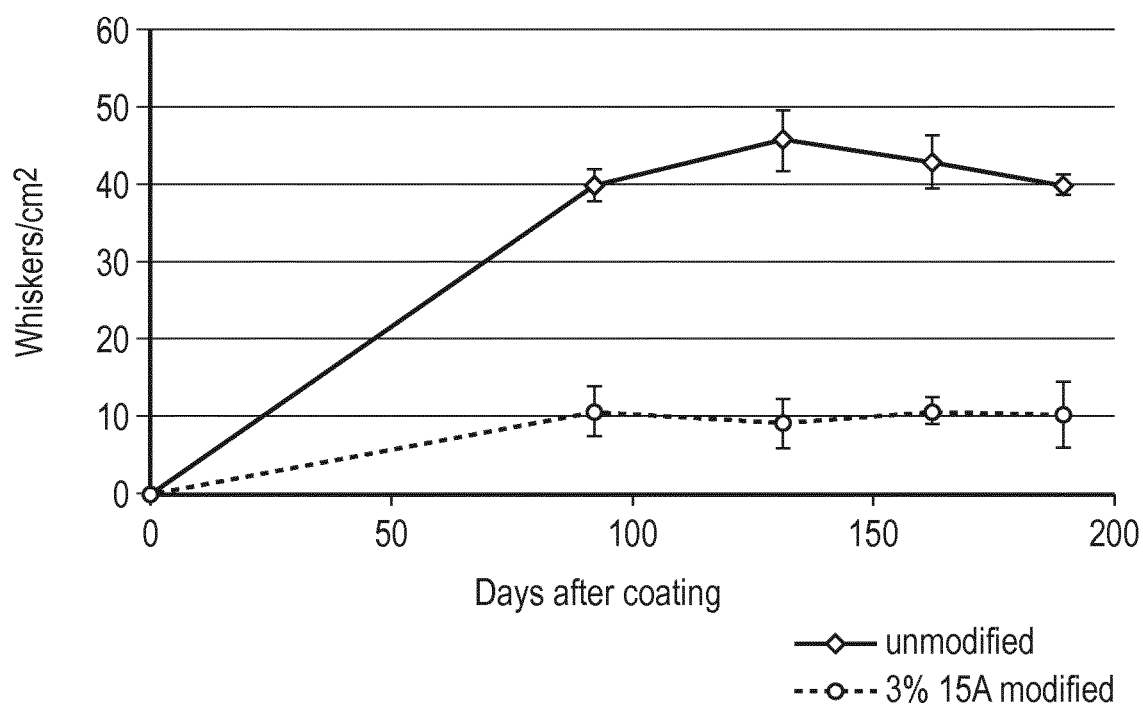
FIG. 12 is a graph comparing whisker growth for unmodified and 3 wt % 15A modified acrylic polymer coatings after oven storage at 55° C. and 85% relative humidity.

To evaluate the effect of the clay additions on whisker growth, test samples were prepared by spray coating unmodified and 3 wt % 15A acrylic polymer modified coatings onto brass substrates electrodeposited with 2 μm of bright tin. After coating, the samples were placed into an oven at 55° C. and 85% relative humidity to promote whisker growth. The extent of whisker growth has been evaluated after different periods of storage at elevated temperature and humidity. Whisker growth was first evaluated after 90 days in the oven. Test samples were analysed using a binocular microscope with the samples tilted at a steep angle to observe features protruding from the deposit surface. Further analyses were subsequently carried out at approximately monthly intervals. The result of these analyses is shown in FIG. 12.

The data clearly demonstrates that whisker growth/tenting is considerably reduced for the samples coated with the 3 wt % 15A acrylic polymer modified material, i.e. measured whisker growth for the samples coated with the nanoclay modified conformal coating is reduced to a quarter of that of the unmodified material. Following the initial analysis whisker density does not appear to increase for either the modified or unmodified coatings.

Figure 13:
FIG. 13 shows scanning electron micrographs comparing the typical whisker size and distribution on the surface of coated 2 μm Sn deposits on brass (a) a 3 wt % 15A modified acrylic polymer conformal coating and (b) an unmodified acrylic polymer conformal coating. Samples tilted at an angle of 70° for observation.
Figure 13:
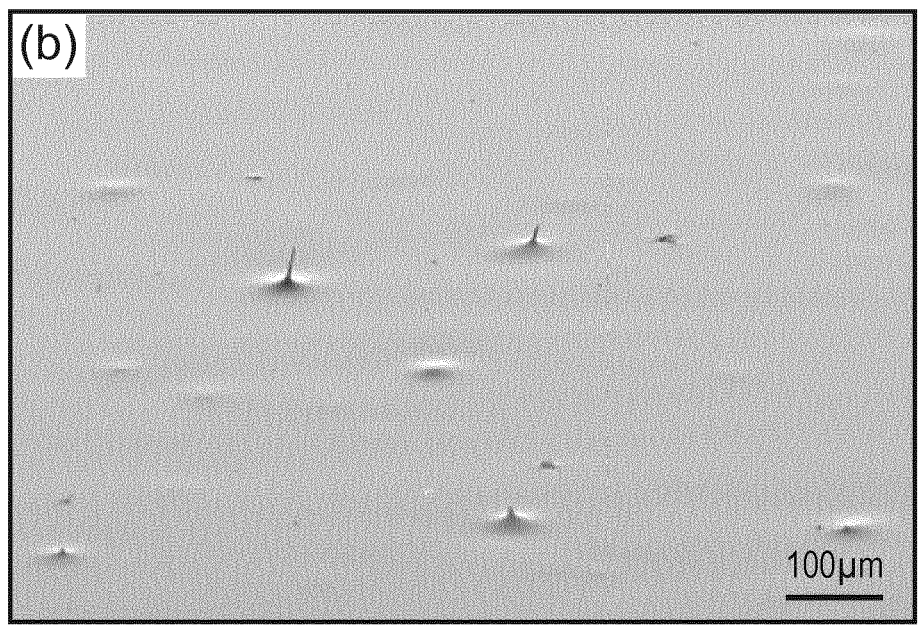

These results are supported by scanning electron microscope (SEM) observations (FIGS. 13(a) and (b)), which demonstrate that whisker growth is generally reduced for samples with the modified coating (SEM analysis was carried out after approximately 14 weeks storage at 55° C./85% relative humidity).

Figure 14:
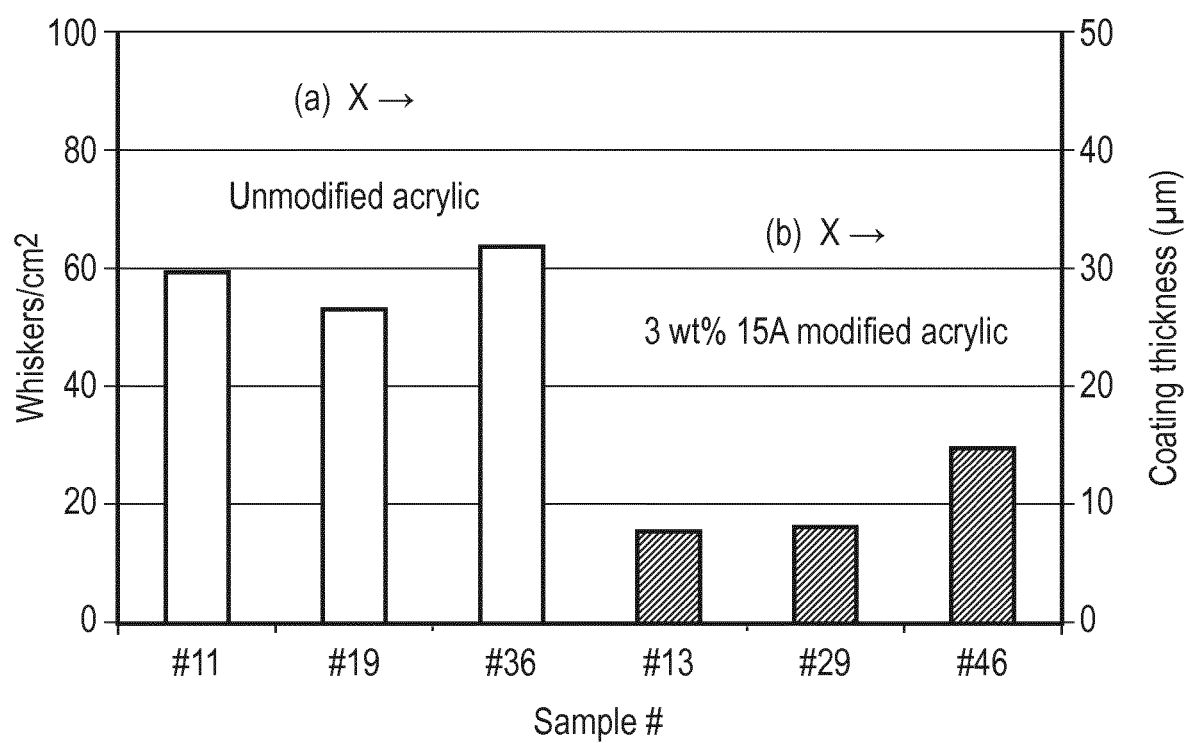
FIG. 14 is a bar chart comparing whisker density for 2 μm Sn deposits on brass coated with unmodified acrylic polymer (hatched bars) and 3 wt % 15A modified (solid bars) acrylic polymer conformal coatings after storage at a combination of room temperature and 55° C./85% humidity for approximately 15 weeks. Estimated coating thickness is also shown for (a) the unmodified acrylic polymer coating and (b) the 3 wt % 15A modified acrylic polymer coating.

Subsequent trials, carried out on a second batch of test samples to substantiate these results, also demonstrated reduced whisker growth for 3 wt % 15A acrylic polymer modified conformal coatings. In this instance whisker counting was carried out twice for each sample and an average value obtained for whisker density. Three test samples were evaluated for the modified and unmodified coatings. The results of this analysis are shown in FIG. 14. The graph also shows an estimate of the average coating thickness in the middle of the test sample that has been evaluated from two equivalent test samples, marked as (a) for the unmodified coating and (b) for the modified coating (this demonstrates that the thickness of the 3 wt % 15A and modified and unmodified acrylic polymer coatings are comparable, at around 46 μm and 42 μm respectively).

Results from the second batch of whisker growth samples confirm that the addition of 3 wt % 15A nanoclay to the acrylic polymer results in a significant reduction in whisker growth.

The invention claimed is:

1. A method of mitigating whisker growth from a metallic surface, the method comprising:
applying a coating composition to at least part of the metallic surface, wherein the coating composition comprises:
a polymer matrix comprising a base polymer, wherein the base polymer is selected from one or more of polyethylene, polypropylene, polystyrene, polyacrylic acid, polyurethanes, acrylics, silicones, paralenes, epoxies, and polyamides, and
insulating material nanoplatelets within the polymer matrix, wherein the insulating material nanoplatelets include a layered silicate clay that is a 2:1 clay, and the nanoplatelets have an average aspect ratio between 200 and 500.

2. The method according to claim 1, wherein the layered silicate clay is a smectite group clay.

3. The method according to claim 1, wherein the layered silicate clay comprises a clay selected from montmorillonite, hectorite and saponite.

4. The method according to claim 1, wherein the layered silicate clay is montmorillonite.

5. The method according to claim 1, wherein the insulating material nanoplatelets have a length of at least 50 nm.

6. The method according to claim 1, wherein the insulating material nanoplatelets have a length of up to 1000 nm.

7. The method according to claim 1, wherein the insulating material nanoplatelets have a length of up to 700 nm.

8. The method according to claim 7, wherein the insulating material nanoplatelets have a length of up to 400 nm.

9. The method according to claim 1, wherein the surface of the insulating material nanoplatelets is functionalised with one or more polar or non-polar functional groups.

10. The method according to claim 9, wherein the base polymer is a non-polar polymer and the insulating material nanoplatelet surfaces are functionalised with one or more non-polar functional groups.

11. The method according to claim 9, wherein the base polymer is selected from one or more of polyethylene, polypropylene and polystyrene.

12. The method according to claim 11, wherein the one or more non-polar functional groups are selected from one or more of linear or branched alkyl, cycloalkyl, linear or branched alkenyl, cycloalkenyl, linear or branched alkynyl, aryl or aralkyl.

13. The method according to claim 9, wherein the base polymer is a polar polymer and the insulating material nanoplatelet surfaces are functionalised with one or more polar functional groups.

14. The method according to claim 13, wherein the base polymer is selected from one or more of polyacrylic acid, polyurethanes, acrylics, silicones, paralenes, epoxies and polyamides.

15. The method according to claim 13, wherein the polar functional group is selected from one or more of —OH, —OR, —NH$_2$, —NHR, —NR$_2$, —NO$_2$, —F, —Cl, —Br, —I, —CN, COOH and COOR, wherein R is selected from linear or branched alkyl, phenyl or benzyl or tallow.

\* \* \* \* \*